(12) United States Patent
Domae et al.

(10) Patent No.: US 11,373,703 B2
(45) Date of Patent: Jun. 28, 2022

(54) SEMICONDUCTOR STORAGE DEVICE

(71) Applicant: KIOXIA CORPORATION, Tokyo (JP)

(72) Inventors: Sumiko Domae, Yokohama Kanagawa (JP); Daisaburo Takashima, Yokohama Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/183,803

(22) Filed: Feb. 24, 2021

(65) Prior Publication Data

US 2021/0287743 A1    Sep. 16, 2021

(30) Foreign Application Priority Data

Mar. 16, 2020    (JP) .............................. JP2020-045190

(51) Int. Cl.
| | | |
|---|---|---|
| G11C 11/00 | (2006.01) | |
| G11C 13/00 | (2006.01) | |
| H01L 45/00 | (2006.01) | |
| H01L 27/24 | (2006.01) | |

(52) U.S. Cl.
CPC ........ G11C 13/0004 (2013.01); G11C 13/003 (2013.01); G11C 13/0069 (2013.01); H01L 27/2436 (2013.01); H01L 45/06 (2013.01); H01L 45/1233 (2013.01); G11C 2013/0078 (2013.01); G11C 2213/79 (2013.01)

(58) Field of Classification Search
CPC .............. G11C 13/0004; G11C 13/003; G11C 13/0069
USPC ......................................................... 365/148
See application file for complete search history.

(56) References Cited

U.S. PATENT DOCUMENTS

| | | | |
|---|---|---|---|
| 7,733,683 B2 | 6/2010 | Takashima et al. | |
| 10,096,619 B2 | 10/2018 | Ino et al. | |
| 2016/0365143 A1 | 12/2016 | Ogiwara et al. | |
| 2017/0243919 A1* | 8/2017 | Seong | ................... H01L 27/249 |
| 2018/0075903 A1* | 3/2018 | Ogiwara | ............ G11C 13/0004 |

FOREIGN PATENT DOCUMENTS

| | | |
|---|---|---|
| JP | 2008-171525 A | 7/2008 |
| WO | 2015/141626 A1 | 9/2015 |

* cited by examiner

*Primary Examiner* — Vu A Le
(74) *Attorney, Agent, or Firm* — Kim & Stewart LLP

(57) ABSTRACT

During a writing operation to change a resistance of a part of a variable resistance material film facing a first word line, the semiconductor storage device applies a first voltage to the first word line, applies a second voltage to a second word line, and applies a third voltage to a third word line. The first, second, and third word lines are stacked above a substrate. The second word line is adjacent to the first word line in the stacking direction. The third word line is not adjacent to the first word line in the stacking direction.

20 Claims, 15 Drawing Sheets

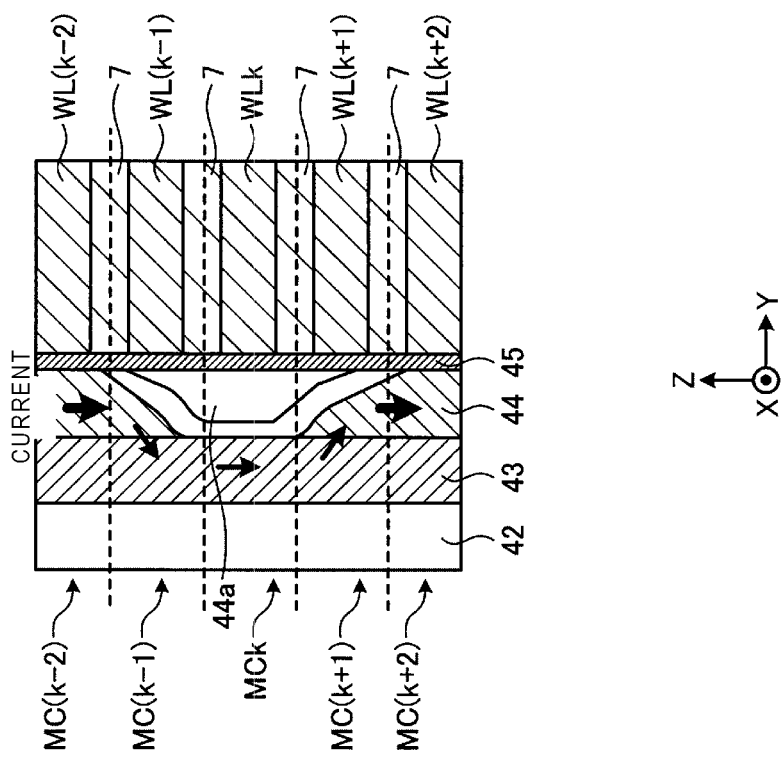

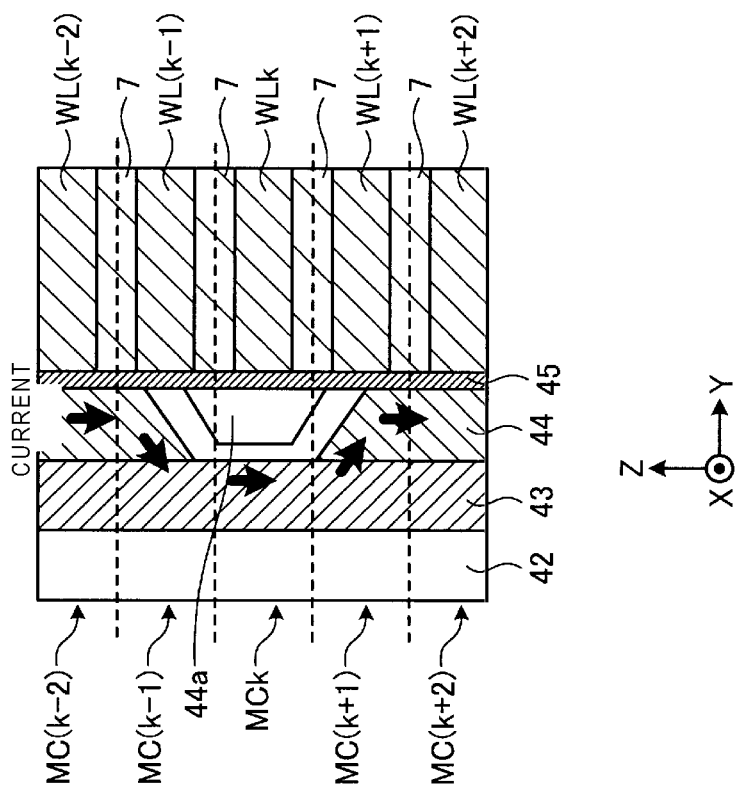

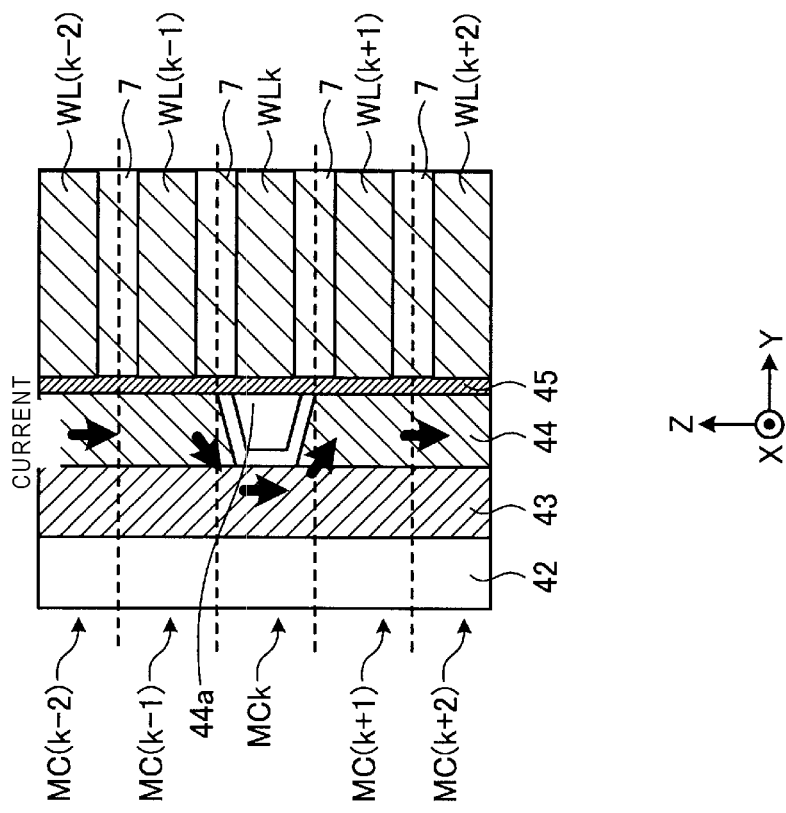

SEMICONDUCTOR STORAGE DEVICE

CROSS-REFERENCE TO RELATED APPLICATION(S)

This application is based upon and claims the benefit of priority from Japanese Patent Application No. 2020-045190, filed Mar. 16, 2020, the entire contents of which are incorporated herein by reference.

FIELD

Embodiments described herein relate generally to a semiconductor storage device.

BACKGROUND

In a semiconductor storage device such as a phase change memory including a plurality of memory cells in which a source and a drain of a transistor are connected to both ends of a variable resistance element, information is stored in the memory cells by turning off a transistor of a selected memory cell, causing a current to flow through the variable resistance element, and changing the variable resistance element to a high resistance state (reset state) or a low resistance state (set state). A high integration of such a semiconductor storage device is desirable.

DESCRIPTION OF THE DRAWINGS

FIGS. 9A and 9B are cross-sectional views showing the operation of the semiconductor storage device according to the embodiment.

FIGS. 12A and 12B are cross-sectional views showing the operation of the semiconductor storage device according to the second modification of the embodiment.

DETAILED DESCRIPTION

Embodiments provide a semiconductor storage device that can be easily highly integrated.

In general, according to one embodiment, there is provided a semiconductor storage device including a plurality of word lines and a memory pillar. The plurality of word lines extend in a first direction and a second direction. The second direction is a direction orthogonal to the first direction. The plurality of word lines are spaced apart from one another in a third direction. The third direction is a direction orthogonal to the first direction and the second direction. The memory pillar extends in the third direction. The memory pillar penetrates the plurality of word lines. The memory pillar includes an insulating film, a conductive film, and a variable resistance material film. The insulating film is on an outer side of the memory pillar and in contact with the plurality of word lines. The conductive film is disposed on an inner side of the insulating film. The variable resistance material film is disposed on an inner side of the conductive film. During a writing operation to change a resistance of a part of a variable resistance material film facing a first word line, the semiconductor storage device applies a first voltage to a first word line, applies a second voltage to a second word line, and applies a third voltage to a third word line. The second word line is a word line adjacent to the first word line in the third direction. The second voltage is a voltage higher than the first voltage. The third word line is a word line not adjacent to the first word line. The third voltage is a voltage that is higher than the first voltage and is different from the second voltage.

Hereinafter, a semiconductor storage device according to an embodiment will be described in detail with reference to the appended drawings. The present disclosure is not limited to the disclosed embodiment.

(Embodiment) A semiconductor storage device according to the embodiment is a nonvolatile semiconductor storage device, and is, for example, a phase change memory including a plurality of memory cells in which a source and a drain of a transistor are connected to both ends of a variable resistance element. In the semiconductor storage device, information is stored in the memory cells by turning off a transistor of a selected memory cell, flowing a current through the variable resistance element, and changing the variable resistance element to a high resistance state (which is referred to herein as a reset state) or a low resistance state (which is referred to herein as a set state). As the variable resistance element, for example, a chalcogenide-based material (Ge, Sb, Te) may be used.

Figure 1A:
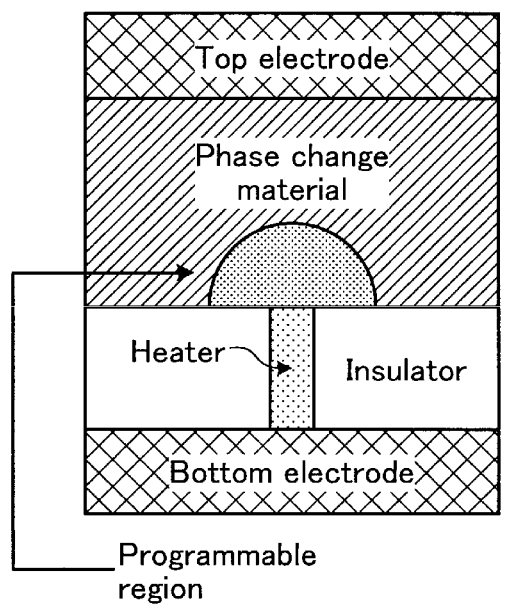
FIGS. 1A and 1B illustrate the principle of storing information in a memory cell according to an embodiment.
Figure 1B:
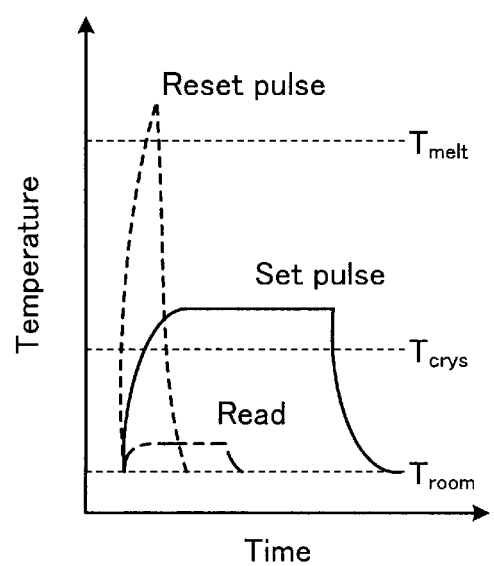

A principle of storing information in the memory cell is schematically illustrated in FIGS. 1A and 1B. FIGS. 1A and 1B illustrate the principle of storing information in the memory cell.

When rewriting the information stored in the memory cell, the semiconductor storage device turns off the transistor in the memory cell and flows a current across both ends of the variable resistance element, so that a snapback (rapid resistance drop) phenomenon occurs in the variable resistance element. When the snapback phenomenon occurs, a large cell current flows through the variable resistance element, and Joule heat causes the variable resistance element to be in a molten state.

For example, when a current flows across both ends (that is, a top electrode and a bottom electrode) of the variable resistance element (phase change material), as shown in FIG. 1A, a resistance component thereof functions as a heater to generate heat, and the heat melts the variable resistance element (for example, chalcogenide glass GST: $Ge_2Sb_2Te_5$), to turn variable resistance element (programmable region) into a molten state.

After that, the information is stored in the memory cells by controlling the current flowing through the variable resistance element according to magnitude and a changing speed of the voltage applied to both ends of the variable resistance element and changing the variable resistance element to the high resistance state HRS (reset state) or the low resistance state LRS (set state). For example, as shown by dotted lines in FIG. 1B, when a voltage that causes the variable resistance element to reach a melting temperature $T_{melt}$, is applied to the memory cell and then the voltage applied to the memory cell is rapidly reduced, the variable resistance element is rapidly cooled from a molten state having a melting temperature of $T_{melt}$ or higher to a room temperature $T_{room}$ and solidified in a state with low crystallinity (for example, an amorphous state), and reaches the high resistance state (reset state). As shown by a solid line in FIG. 1B, when a voltage that reaches a crystallization temperature $T_{crys}$ is applied to the memory cell and then the voltage applied to the memory cell is gradually reduced, the variable resistance element is gradually cooled and solidified in a state with high crystallinity (for example, a crystallized state), and reaches the low resistance state (set state).

When the information stored in the memory cell is read, as shown by the one dot chain line in FIG. 1B, by applying a voltage to maintain the temperature to be lower than the crystallization temperature $T_{crys}$ and detecting a flowing current level and the like, data is detected depending on whether the memory cell is in the low resistance state or the high resistance state.

In order to improve the density of a memory cell array, a three-dimensional memory cell array may be constructed. In a semiconductor storage device, on a substrate, a stacked body in which conductive layers and insulating layers are alternately stacked is penetrated by a columnar body including a variable resistance material film and a semiconductor film, and the three-dimensional memory cell array is formed at a position where the conductive layers intersect with the columnar body. A part of the variable resistance material film that intersects with the conductive layer functions as the variable resistance element in the memory cell.

Figure 2:
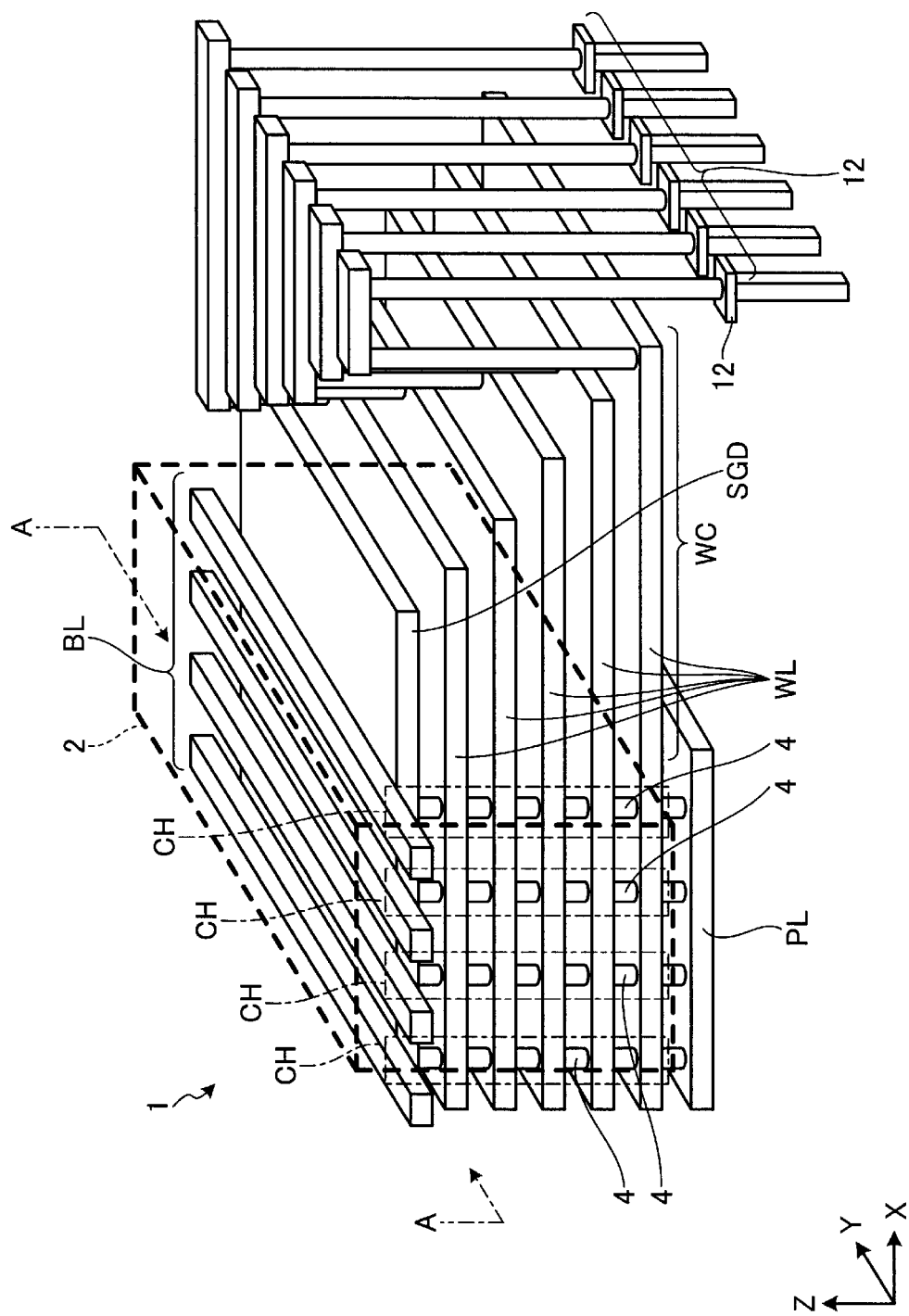
FIG. 2 is a perspective view showing a configuration of a semiconductor storage device according to the embodiment.

Specifically, a semiconductor storage device 1 is configured as shown in FIG. 2. FIG. 2 is a perspective view showing a configuration of the semiconductor storage device 1.

The semiconductor storage device 1 is a three-dimensional semiconductor memory, and is, for example, a phase change memory. The semiconductor storage device 1 includes a memory cell array 2, word lines WL, select gate lines SGD, bit lines BL, and plate lines PL. Hereinafter, an extension direction of the bit lines BL is a Y direction, a stacking direction of memory cell transistors is a Z direction, and a direction perpendicular to the Y direction and the Z direction is an X direction.

Figure 4:
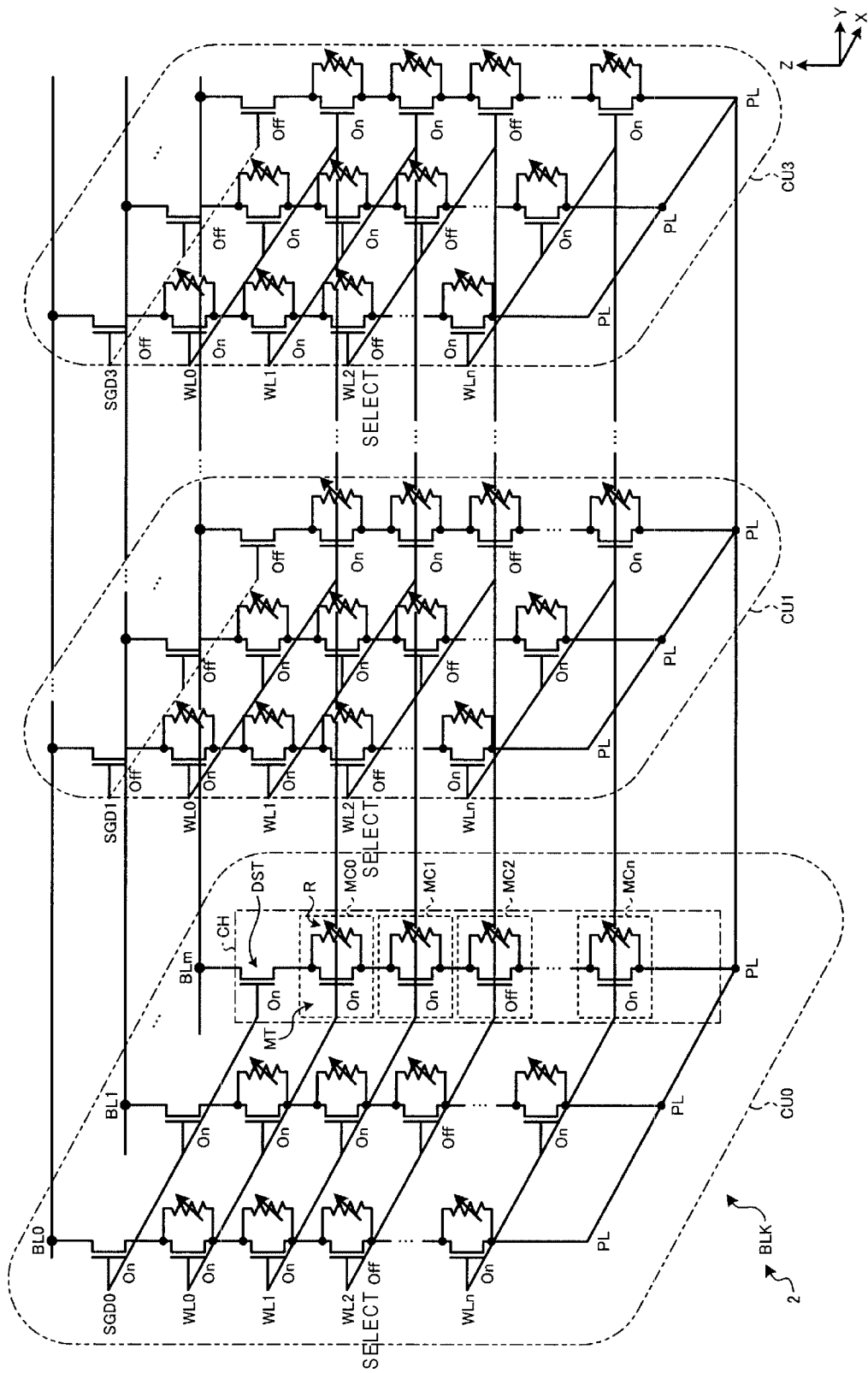
FIG. 4 is a circuit diagram showing a configuration of a memory cell array according to the embodiment.
Figure 5:
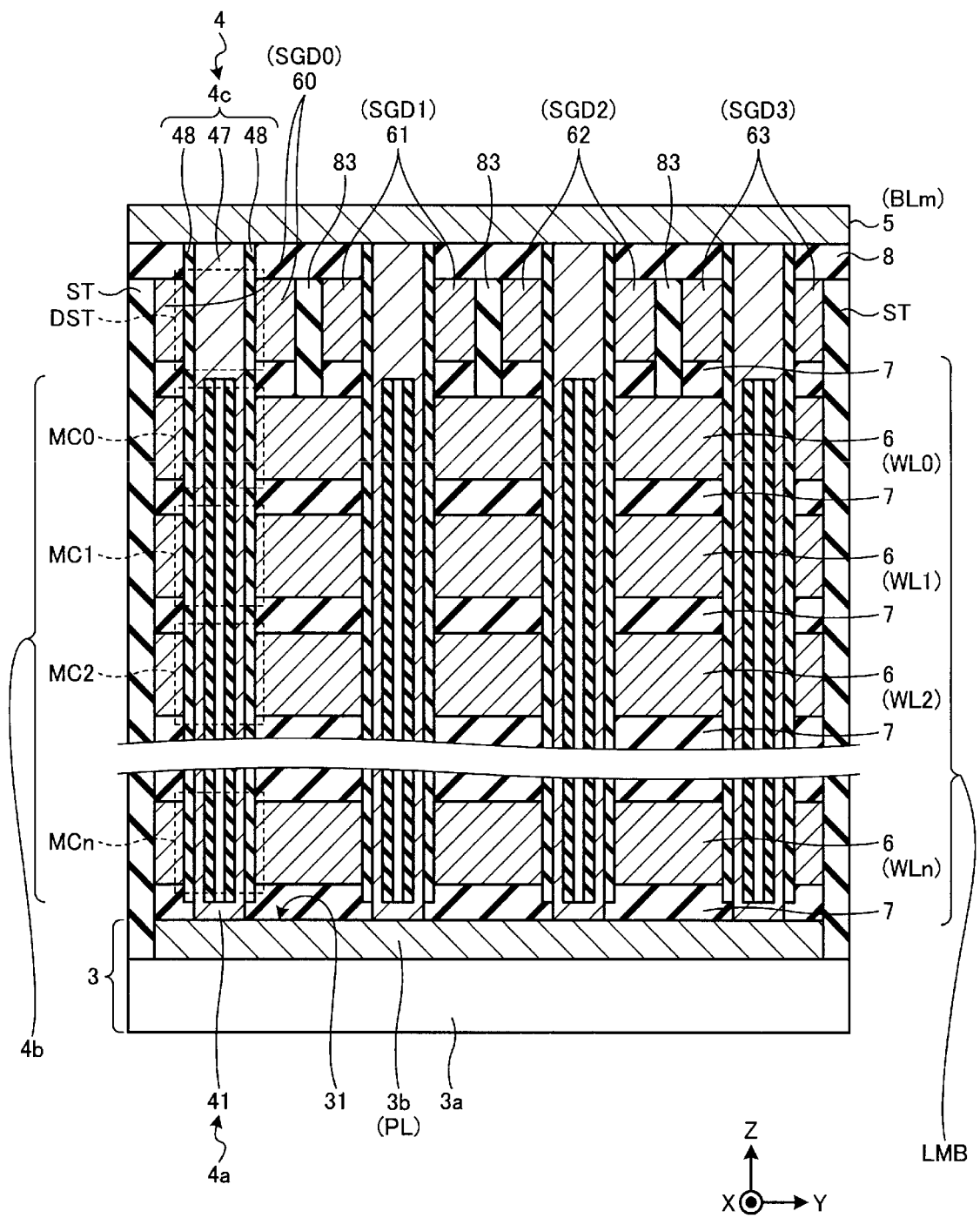
FIG. 5 is a cross-sectional view showing the configuration of the memory cell array according to the embodiment.

The memory cell array 2 shown in FIG. 2 has a configuration in which a plurality of memory chains CH are disposed on a substrate 3 (see FIG. 5). The memory chain includes a memory cell column in which one or more memory cells are arranged in the Z direction and a drain-side select transistor provided at an upper end of the memory cell column. In the memory chain CH, a plurality of memory cells MC0 to MCn are connected in series in a chain. The plurality of memory cells MC0 to MCn (n is any integer of 2 or more) and select transistors DST (see FIG. 4) are formed at positions where conductive layers (WL, SGD) and a columnar body (e.g., memory pillar) 4 intersect in a structure in which the columnar body 4 penetrates a stacked body LMB (see FIG. 5). In the stacked body LMB, the conductive layer (WL, SGD) and insulating layers are repeatedly arranged in the Z direction. Each memory cell MC0 to MCn includes one transistor and one storage element. The storage element is a variable resistance element R (see FIG. 4), and the transistor controls whether to select the variable resistance element R. In the memory cells MC0 to MCn, a part of the plate-shaped conductive layer (word line WL) that intersects with the columnar body 4 functions as a gate of a memory select transistor MT. In the drain-side select transistor DST, apart of the plate-shaped conductive layer (select gate lines SGD) that intersects with the columnar body 4 functions as a gate. FIG. 2 illustrates a configuration in which five memory cells MC are provided in one memory chain CH.

The word line WL extends in an XY direction and connects gates of the memory cells that are at the same height of the memory chains CH that are present in a predetermined range. The select gate line SGD extends in the XY direction and connects gates of the drain-side select transistors DST of the memory chains CH that are present in a predetermined range. The bit line BL extends along the Y direction and is connected to a +Z side end portion of each memory chain CH.

Figure 3:
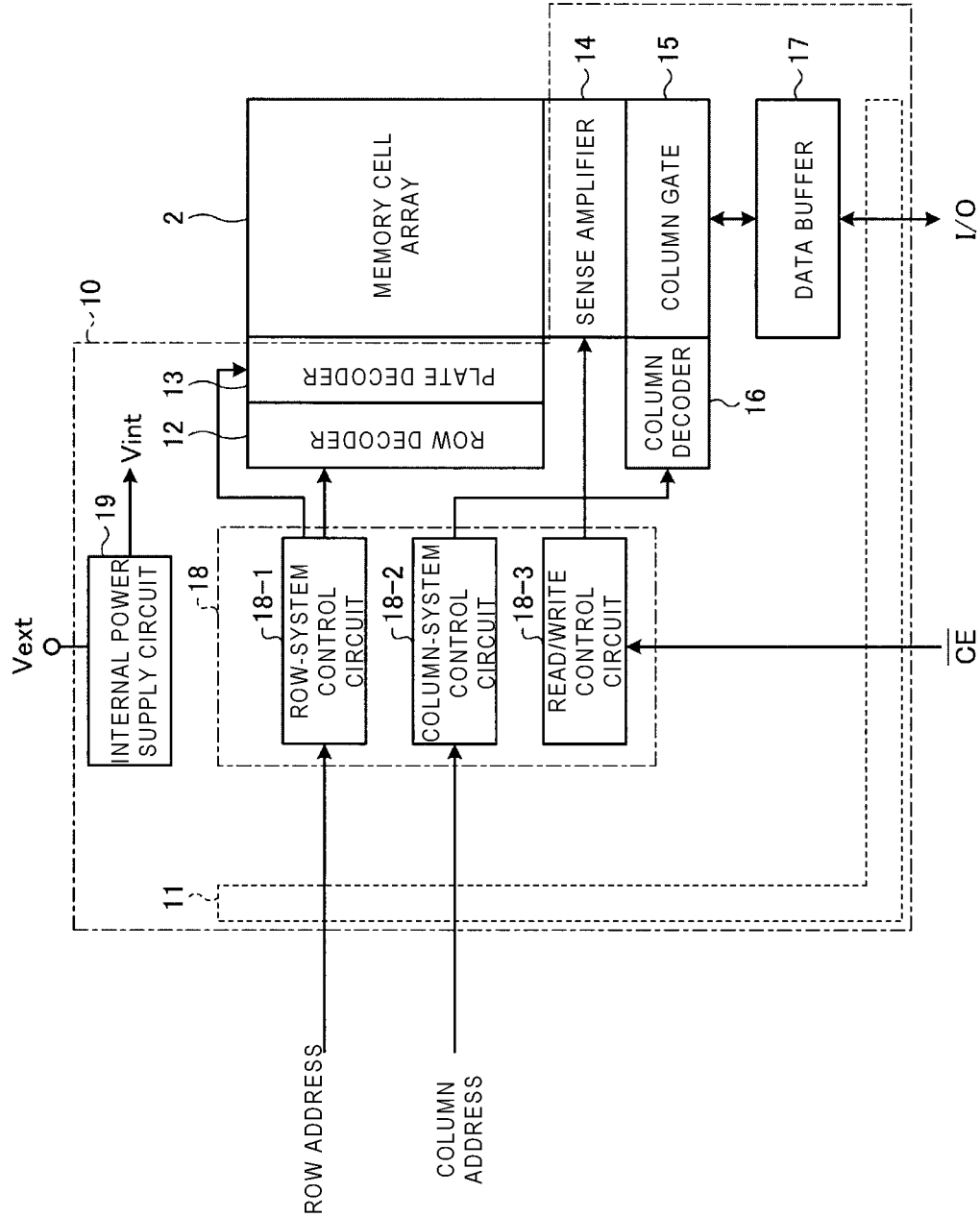
FIG. 3 is a block diagram showing the configuration of the semiconductor storage device according to the embodiment.

The semiconductor storage device 1 further includes a peripheral circuit 10 as shown in FIG. 3. FIG. 3 is a block diagram showing a configuration of the semiconductor storage device 1. The peripheral circuit 10 is provided around the memory cell array 2. The peripheral circuit 10 includes an interface 11 with an outside of the semiconductor storage device 1 (for example, a memory controller).

The peripheral circuit 10 controls an operation of the semiconductor storage device 1 based on an instruction input from the outside via the interface 11. For example, when a write command including write data and a row address is received, the peripheral circuit 10 performs a write operation of writing the write data into a memory cell of the row address in the memory cell array 2. When a read command including a row address and a column address is received, the peripheral circuit 10 performs a read operation of outputting data from the memory cell of the row address and the column address to the outside (e.g., memory controller) via the interface 11.

The peripheral circuit 10 further includes a row decoder 12, a plate decoder 13, a sense amplifier 14, a column gate 15, a column decoder 16, a data buffer 17, a control circuit 18, and an internal power supply circuit 19. The control circuit 18 includes a row-system control circuit 18-1, a column-system control circuit 18-2, and a read/write control circuit 18-3.

The sense amplifier circuit 14 includes a plurality of sense amplifiers corresponding to a plurality of bit lines BL, and each sense amplifier detects and amplifies data read to the corresponding bit line BL. The column gate 15 includes a plurality of gates corresponding to a plurality of sense amplifiers, and selects a column of the memory cell array 2 by activating any one of the plurality of gates, and transfers data of a selected bit line BL to the data buffer 17. The column decoder 16 decodes a column control signal received from the column-system control circuit 18-2, and activates any one of the plurality of gates in the column gate 15 according to a decoding result. The data buffer 17 temporarily stores data to be transferred between the sense amplifier circuit 14 and an I/O terminal of the interface 11.

The row-system control circuit 18-1 takes in a row address and generates a row control signal and a plate control signal based on the row address. The row-system control circuit 18-1 supplies the row control signal to the row decoder 12, and supplies the plate control signal to the plate decoder 13. The column-system control circuit 18-2 takes in the column address and generates a column control signal based on the column address. The column-system control circuit 18-2 supplies the column control signal to the column decoder 16. The read/write control circuit 18-3 is a circuit that performs read or write control.

The row decoder 12 decodes the row control signal, supplies a selection voltage to a selected word line WL, and supplies a non-selection voltage to a non-selected word line WL based on a decoding result. The row decoder 12 supplies the selection voltage to a select gate line SGD corresponding to the selected memory chain CH and supplies the non-selection voltage to a non-selected select gate line SGD based on the decoding result. The plate decoder 13 controls a voltage of the plate line PL to a predetermined voltage level based on the plate control signal.

The internal power supply circuit 19 that generates an internal power supply voltage Vint by supplying an external power supply voltage Vext is also provided in a memory chip. The internal power supply circuit 19 may include a booster circuit that generates a boosted voltage as necessary.

A chip enable signal/CE supplied from outside the chip sets the memory chip to an active state. That is, normally, the external power supply is turned on, and the chip enable signal/CE is set to the active level (for example, an L level), so that the memory cell array 2 can be accessed by the control circuit 18.

The row decoder 12 shown in FIG. 3 may be provided as shown in FIG. 2. In FIG. 2, the word lines WL and select gate lines SGD of the memory cell array 2 and the row decoder 12 are connected to one another via a contact, an upper wiring, and a contact, respectively, at a word line contact portion WC provided in the memory cell array 2. In FIG. 2, in the word line contact portion WC provided on a +X side of the memory cell array 2, a structure is schematically shown in which word lines WL and a select gate line SGD connected to memory cells MC and a select transistor at different heights are processed in a stepped shape.

Next, a circuit configuration of the memory cell array 2 will be described with reference to FIG. 4. FIG. 4 is a diagram showing the circuit configuration of the memory cell array 2. FIG. 4 is a diagram showing the circuit configuration of the memory cell array 2, and schematically shows one block BLK among a plurality of blocks BLK provided in the memory cell array 2. In FIG. 4, word lines WL2 are the selected word lines, and the other word lines WL0, WL1, WL3 . . . WLn are the non-selected word lines.

In FIG. 4, for example, n+1 (n is an integer of 2 or more) word lines WL0 to WLn, a plurality of select gate lines SGD0 to SGD3, and plate lines PL are provided in a block BLK. m+1 (m is an integer of 2 or more) bit lines BL0 to BLm are provided in the block BLK. Corresponding to the plurality of select gate lines SGD0 to SGD3, the block BLK may be divided into a plurality of chain units CU0 to CU3. In each block BKL, one of the plurality of chain units CU0 to CU3 is selectively drivable. Each of the chain units CU0 to CU3 includes a plurality of memory chains CH sharing the select gate line SGD.

In the block BLK, m+1 memory chains CH are arranged in the X direction. The m+1 memory chains CH correspond to m+1 bit lines BL0 to BLm, and each memory chain CH is connected to a corresponding one of the bit lines BL0 to BLm on the +Z side. Four memory chains CH are arranged in the Y direction. The four memory chains CH correspond to one bit line BL, and each memory chain CH is connected to a corresponding one of the bit lines BL on the +Z side.

That is, (m+1)×4 memory chains CH are arranged in the X direction and the Y direction. The (m+1)×4 memory chains CH correspond to one plate line PL (see FIG. 1), and are connected to the plate line PL on a −Z side. In FIG. 4, the plate line PL is shown as a set of a plurality of lines electrically connected to one another.

In the memory chain CH, a select transistor DST and memory cells MC0 to MCn are provided along the Z direction. Each of the memory cells MC0 to MCn is, for example, a one-transistor one-capacitor type memory cell, and includes a memory cell select transistor MT and a variable resistance element R that are connected in parallel. The memory cell select transistor MT is, for example, one transistor. A plurality of memory cell select transistors MT are connected in series, and the variable resistance element R is connected in parallel to each memory cell select transistor MT. That is, one end of the variable resistance element R is electrically connected to one of the source and the drain of the memory cell select transistor MT, and the other end of the variable resistance element R is electrically connected to the other of the source and the drain of the memory cell select transistor MT.

Each of the select transistors DST is, for example, one transistor. Each memory chain CH is configured such that the drain-side select transistor DST are connected in series to the memory cell select transistor MT of the memory cell MC0 that is on the most drain side of the memory cells MC0 to MCn. Each select gate line SGD is electrically connected to a gate of a corresponding one of the select transistors DST of the chain unit CU.

In each memory chain CH, the gate of each memory cell select transistor MT is connected to a word line WL. One end of each memory chain CH is connected to a bit line BL via the drain-side select transistor DST, and the other end of each memory string MST is connected to a plate line PL.

Next, a specific configuration of the memory cell array 2 will be described with reference to FIG. 5. FIG. 5 is a diagram showing a cross-sectional configuration of the memory cell array 2, and shows a cross section (YZ cross section) when the memory cell array 2 shown in FIG. 2 is cut in a vertical direction (YZ direction) along line A-A.

The memory cell array 2 is configured as a three-dimensional memory cell array in which, as shown in FIG. 5, the columnar body 4 is two-dimensionally arranged in an XY direction on the substrate 3 and the stacked body LMB is penetrated by the columnar body 4.

The substrate 3 shown in FIG. 5 has a semiconductor region (also referred to as a well region) 3a and a semiconductor region 3b. Each of the semiconductor region 3a and the semiconductor region 3b contains a first conductivity type impurity. For example, when the first conductivity type is a P type, the first conductivity type impurity may be boron. The semiconductor region 3b has a higher concentration of the first conductivity type impurity than the semiconductor region 3a, and functions as a buried conductive layer (plate line PL). Although not shown, the supply of voltage to the semiconductor region 3b may be performed from the peripheral circuit 10 via another semiconductor region electrically connected to the semiconductor region 3b in the substrate 3 and a predetermined wiring electrically connected to the other semiconductor region.

A plurality of stacked bodies including the stacked body LMB may be disposed on the substrate 3. The plurality of stacked bodies may be disposed at positions offset from one another in the Y direction with a separation portion ST in between. In the separation portion ST, at least a surface in contact with the stacked body LMB is formed of an insulating material. The separation portion ST electrically separates the stacked body LMB from other stacked bodies. The separation portion ST has a substantially fin shape extending in the X direction and the Z direction. Although not shown, the separation portion ST may include two ZX flat plate-shaped insulating portions and a ZX flat plate-shaped electrode portion sandwiched between the two insulating portions. The electrode portion may be used as a part of a predetermined wiring for supplying a voltage to the semiconductor region 3b.

In the stacked body LMB, conductive layers 6 and insulating layers 7 are alternately and repeatedly stacked. In the stacked body LMB, a plurality of conductive layers 6 are disposed apart from one another in the Z direction. Each conductive layer 6 may be formed of a material containing a conductive material (for example, a metal such as tungsten) as a main component. Each insulating layer 7 may be formed of a material containing an insulating material (for example, a semiconductor oxide such as a silicon oxide) as a main component. The stacked body LMB includes n+1 conductive layers 6, and the n+1 conductive layers 6 function as word lines WLn, WL(n−1), . . . , WL2, WL1, and WL0 in order from the −Z side to the +Z side.

Drive electrode films 60 to 63 are stacked on an uppermost insulating layer 7 (most +Z side insulating layer 7) of the stacked body LMB. Each of the drive electrode films 60 to 63 may be formed of a material containing a conductive material (for example, a metal such as tungsten) as a main component. The drive electrode film 60 functions as the select gate line SGD0, the drive electrode film 61 functions as the select gate line SGD1, the drive electrode film 62 functions as the select gate line SGD2, and the drive electrode film 63 functions as the select gate line SGD3. The drive electrode films 60 to 63 are separated in the Y direction by insulating films 83. The insulating films 83 are provided above the word line WL (+Z side), extend in the X direction and the Z direction, and reach the uppermost insulating layer 7 of the stacked body LMB. Accordingly, the drive electrode films 60 to 63 are electrically insulated from one another.

The columnar body 4 includes a columnar lower portion 4a, a columnar main portion 4b, and a columnar upper portion 4c. The columnar main portion 4b is provided between the columnar lower portion 4a and the columnar upper portion 4c in the Z direction.

The columnar lower portion 4a is provided on the substrate 3. The columnar lower portion 4a extends from a surface 31 of the substrate 3 to a Z position between the first conductive layer 6 (WLn) and the surface 31 of the substrate 3. The columnar lower portion 4a includes a semiconductor film 41. The semiconductor film 41 is formed of a material containing a semiconductor (for example, silicon) as a main component and includes the first conductivity type impurity. When the first conductivity type is the P type, the first conductivity type impurity may be boron. The semiconductor film 41 may contain the first conductivity type impurity at the same concentration as the first conductivity type impurity in the semiconductor region 3b. A lower end (end portion on the −Z side) of the semiconductor film 41 may reach a position lower than the surface 31 of the substrate 3 in the semiconductor region 3b. The semiconductor film 41 is electrically connected to the semiconductor region 3b (plate line PL).

The columnar main portion 4b is provided on the columnar lower portion 4a (+Z side). The columnar main portion 4b extends from the Z position between the first conductive layer 6 (WLn) and the surface 31 of the substrate 3 to the Z position between the (n+1)th conductive layer 6 (WL0) and the drive electrode films 60 to 63. In positions where the columnar main portion 4b intersects with the n+1 layer conductive layer 6 in the stacked body LMB, memory cells MCn, MC(n−1), . . . , MC2, MC1, MC0 are sequentially arranged from the −Z side to the +Z side.

Figure 6A:
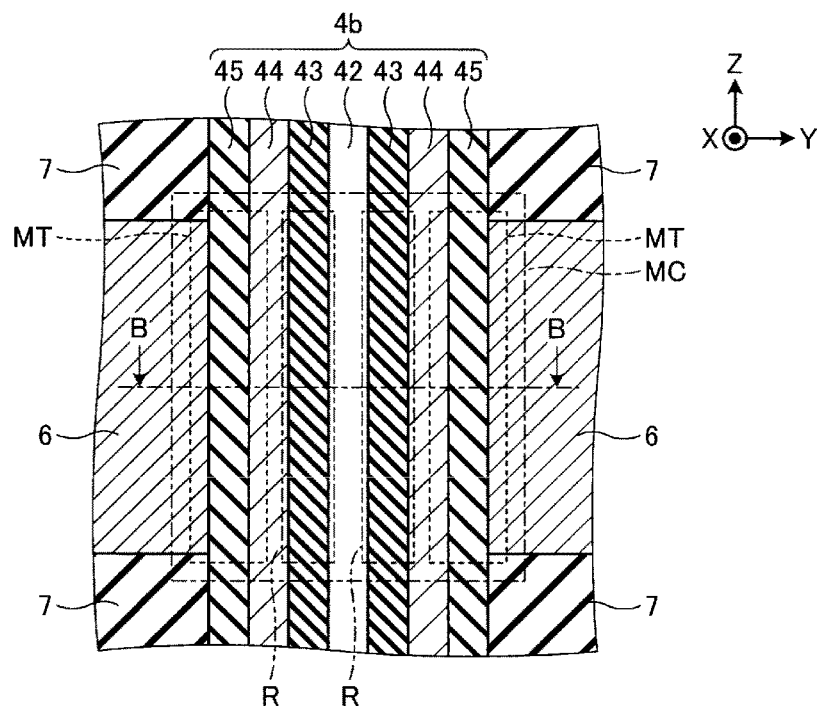
FIGS. 6A, 6B and 6C are cross-sectional views and a plan view that show a configuration of the memory cell according to the embodiment.
Figure 6B:
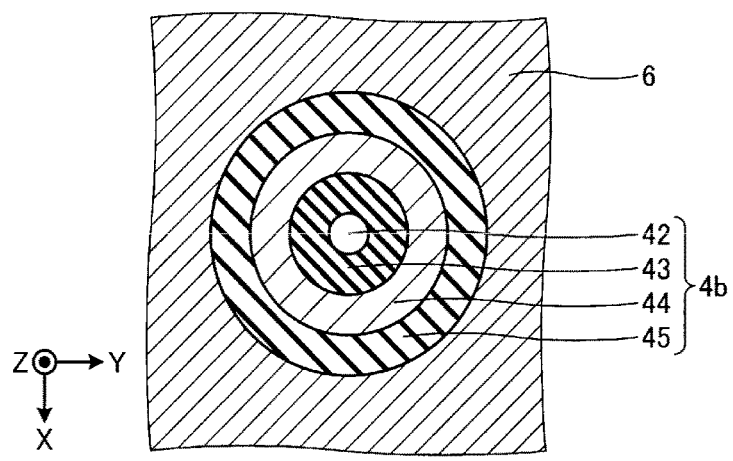
Figure 6C:
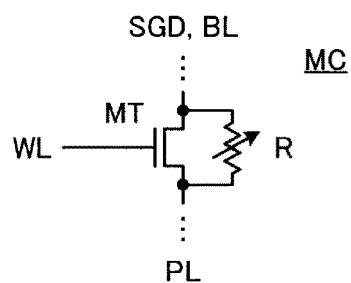

As shown in FIGS. 6A and 6B, the columnar main portion 4b includes a core insulating film 42, a variable resistance material film 43, a semiconductor film 44, and an insulating film 45. FIG. 6A is a cross-sectional view showing a configuration of a memory cell, and is an enlarged cross-sectional view showing a part including a memory cell MC (any one of MC0 to MCn) in FIG. 5. FIG. 6B is a plan view showing the configuration of the memory cell, and shows a cross section of FIG. 6A taken along line B-B. FIG. 6C shows an equivalent circuit of each memory cell MC.

The core insulating film 42 is provided near a central axis of the columnar body 4 and extends along the central axis of the columnar body 4. The core insulating film 42 may be formed of a material containing an insulating material (for example, silicon nitride) as a main component. The core insulating film 42 has a substantially I shape in a ZY cross-sectional view, and has a substantially I shape in a ZX cross-sectional view.

The variable resistance material film 43 is provided between the core insulating film 42 and the conductive layer 6, surrounds the core insulating film 42 from the outside, and extends along the central axis of the columnar body 4. The variable resistance material film 43 may be formed of a material exhibiting resistance change characteristics due to phase change. For example, the variable resistance material film 43 may be formed of a chalcogenide-based material (Ge, Sb, Te). The variable resistance material film 43 has a substantially columnar shape and has a substantially cylindrical shape.

The semiconductor film 44 is provided between the variable resistance material film 43 and the conductive layer 6, surrounds the variable resistance material film 43 from the outside, and extends along the central axis of the columnar body 4. The semiconductor film 44 may be formed of a material containing a semiconductor (for example, silicon) as a main component. The semiconductor film 44 has a substantially cylindrical shape. A lower end (end portion on the −Z side) of the semiconductor film 44 is electrically connected to the semiconductor film 41.

The insulating film 45 is provided between the semiconductor film 44 and the conductive layer 6, surrounds the variable resistance material film 43 from the outside, and extends along the central axis of the columnar body 4. The insulating film 45 may be formed of a material containing an insulating material (for example, silicon nitride) as a main component.

In the columnar main portion 4b, a region that intersects with the conductive layer 6 functions as the memory cell MC as indicated by a one dot chain line in FIG. 6A. Among the region that functions as the memory cell MC, as shown by being surrounded by the dotted line in FIG. 6A, a part where the conductive layer 6/the insulating film 45/the semiconductor film 44 are stacked in a radial direction of the columnar body 4 functions as the select transistor MT, and as shown by being surrounded by a two-dot chain line in FIG. 6A, the variable resistance material film 43 functions as the variable resistance element R.

As shown in FIG. 5, the columnar upper portion 4c is provided on the columnar main portion 4a (+Z side). The columnar upper portion 4c extends from the Z position between the (n+1)th conductive layer 6 (WL0) and the drive electrode films 60 to 63 to the Z position higher than the drive electrode films 60 to 63. A drain-side select transistor DST is formed at a position where the columnar upper portion 4c intersects with the drive electrode films 60 to 63. The columnar upper portion 4c includes a semiconductor film 47 and an insulating film 48.

The semiconductor film 47 is provided at a position in the central axis of the columnar body 4 and extends along the central axis of the columnar body 4. The semiconductor film 47 may be formed of a material containing a semiconductor (for example, silicon) as a main component. The semiconductor film 47 has a substantially I shape in the ZY cross-sectional view, and has a substantially I shape in the ZX cross-sectional view. A lower end (end portion on the −Z side) of the semiconductor film 47 is electrically connected to the semiconductor film 44. An upper end (end portion on the +Z side) of the semiconductor film 47 is electrically connected to a conductive layer 5 (bit line BLm). The semiconductor film 41, the semiconductor film 44, and the semiconductor film 47 form a columnar semiconductor member extending continuously from the surface 31 of the substrate 3 to the Z position higher than the drive electrode films 60 to 63, include a channel region (active region) in the memory chain CH, and may be formed of a material that contains a semiconductor (for example, polysilicon) containing substantially no impurities, as a main component.

The insulating film 48 is provided between the semiconductor film 47 and the drive electrode films 60 to 63, surrounds the semiconductor film 47 from the outside, and extends along the central axis of the columnar body 4. The insulating film 48 may be formed of a material containing an insulating material (for example, silicon nitride) as a main component. The lower end (end portion on the −Z side) of the insulating film 48 is connected to the insulating film 45, and the insulating film 48 and the insulating film 45 form an insulating film extending continuously from the Z position between the first conductive layer 6 (WLn) and the surface 31 of the substrate 3 to the Z position higher than the drive electrode films 60 to 63.

An interlayer insulating film 8 is provided on the drive electrode films 60 to 63 (+Z side). The interlayer insulating film 8 may be formed of a material containing an insulating material (for example, a semiconductor oxide such as silicon oxide) as a main component.

The conductive layer 5 is provided on the interlayer insulating film 8. The conductive layer 5 functions as the bit line BL. The conductive layer 5 may be formed of a material containing a conductive material (for example, a metal such as tungsten or aluminum) as a main component.

A contact plug (not shown) may be provided between the conductive layer 5 and the semiconductor film 47. In this case, the contact plug contacts the conductive layer 5 at an upper end, and contacts the semiconductor film 47 at a lower end, so that the conductive layer 5 and the semiconductor film 47 can be electrically connected. The contact plug functions as a bit line contact. The contact plug may be formed of a material containing a conductive material (for example, a metal such as tungsten) as a main component.

According to such a structure, the memory cell MC in which the memory cell select transistor MT and the variable resistance element R are connected in parallel is formed. In this configuration, if a size of each memory cell MC in the Z direction and an interval with respect to the adjacent memory cell MC are narrowed, when the memory cell select transistor MT of the selected memory cell MC is turned off and a current is passed through the variable resistance element R, information may be erroneously stored in a non-selected memory cell MC adjacent to a selected memory cell MC. That is, a size margin of the memory cell MC in the Z direction and an interval margin between the memory cells MCs tend to be strict. Correspondingly, if the size of the memory cell MC and the interval between the memory cells MCs in the Z direction are designed to be wide, it may be difficult to effectively achieve high integration of the semiconductor storage device 1.

Therefore, in the present embodiment, in the semiconductor storage device 1, in a writing operation performed on the selected memory cell MC in the memory cell array 2, a voltage higher than a selected voltage and different from a non-selected voltage is applied to the word line WL connected to the non-selected memory cell MC adjacent to the selected memory cell MC, so that the size of the memory cell MC in the Z direction and the interval between the memory cells MCs can be made smaller, and the semiconductor storage device 1 can be effectively highly integrated.

Figure 7:
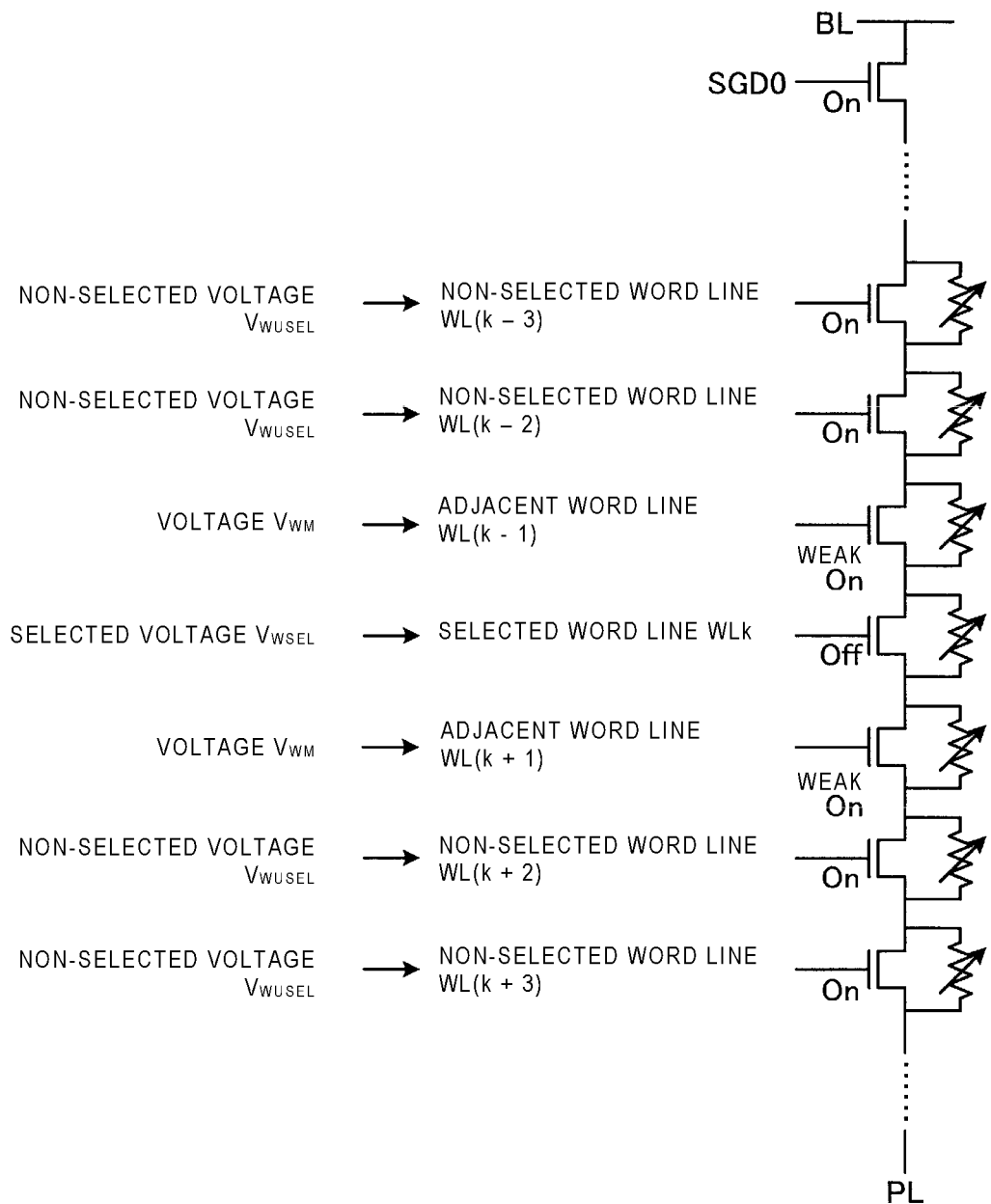
FIG. 7 is a circuit diagram showing an operation of the semiconductor storage device according to the embodiment.

Specifically, the semiconductor storage device 1 performs a writing operation for changing a resistance value of a part (variable resistance element R) facing the word line WLk (k is an integer of 0 or more and n or less) in the variable resistance material film 43. As shown in FIG. 7, during the writing operation, the semiconductor storage device 1 applies a selected voltage $V_{WSEL}$ to the selected word line WLk, and a voltage $V_{WM}$ that is higher than a selected voltage $V_{WSEL}$ and is different from a non-selected voltage $V_{WUSEL}$ is applied to the adjacent word lines WL(k−1) and WL(k+1) adjacent to the selected word line WLk in the Z direction. FIG. 7 is a circuit diagram showing the operation of the semiconductor storage device 1. For example, the semiconductor storage device 1 may apply a voltage level between the selected voltage $V_{WSEL}$ and the non-selected voltage $V_{WUSEL}$ as the voltage $V_{WM}$. The semiconductor storage device 1 applies a non-selected voltage $V_{WUSEL}$ to non-selected word lines WL0 to WL(k−2) and WL(k+2) to WLn other than the adjacent word lines during the writing operation. For example, the selected voltage $V_{WSEL}$=0V, the non-selected voltage $V_{WUSEL}$=4V, and the voltage $V_{WM}$=2V may be used.

When the writing operation to change the resistance value of the part (variable resistance element R) facing the word line WL0 of the uppermost layer or the word line WLn of the lowermost layer is performed (when k is 0 or n), the selective voltage $V_{WSEL}$ is applied to the word line WL0 or the word line WLn which is the selected word line WLk, the voltage $V_{WM}$ that is higher than the selected voltage $W_{WSEL}$ and is different from the non-selected voltage $V_{WUSEL}$ is applied to the adjacent word line WL1 or the adjacent word line WL(n−1), and the non-selected voltage $V_{WUSEL}$ is applied to the other word lines WL2 to WLn or word lines WL0 to WL(n−2).

By applying voltages as described above, the select transistor MT of the selected memory cell MC is turned off, the memory cell select transistor MT of the memory cell MC (adjacent memory cell MC) adjacent to the selected memory cell MC in the Z direction is weakly turned on, and the memory cell select transistor MT of the other memory cell MC (non-selected memory cell MC) is turned on. Accordingly, the cell current can pass through a path of a channel region of the memory cell select transistor MT of the non-selected memory cell MC→a channel region of the memory cell select transistor MT of the adjacent memory cell MC→the variable resistance material film 43 (variable resistance element R) of the selected memory cell MC→the channel region of the memory cell select transistor MT of the adjacent memory cell MC→the channel region of the memory cell select transistor MT of the non-selected memory cell MC. Accordingly, when the size of the memory cell MC in the Z direction and an interval between the memory cells MCs are shortened, erroneous writing to the adjacent memory cell MC can be prevented, and writing to the selected memory cell MC can be promoted. Therefore, since the size margin of the memory cell MC and the interval margin between the memory cells MCs in the Z direction can be easily secured, the size of the memory cell MC and the interval between the memory cells MCs in the Z direction can be made smaller, and the semiconductor storage device 1 can be effectively highly integrated.

Figure 8:
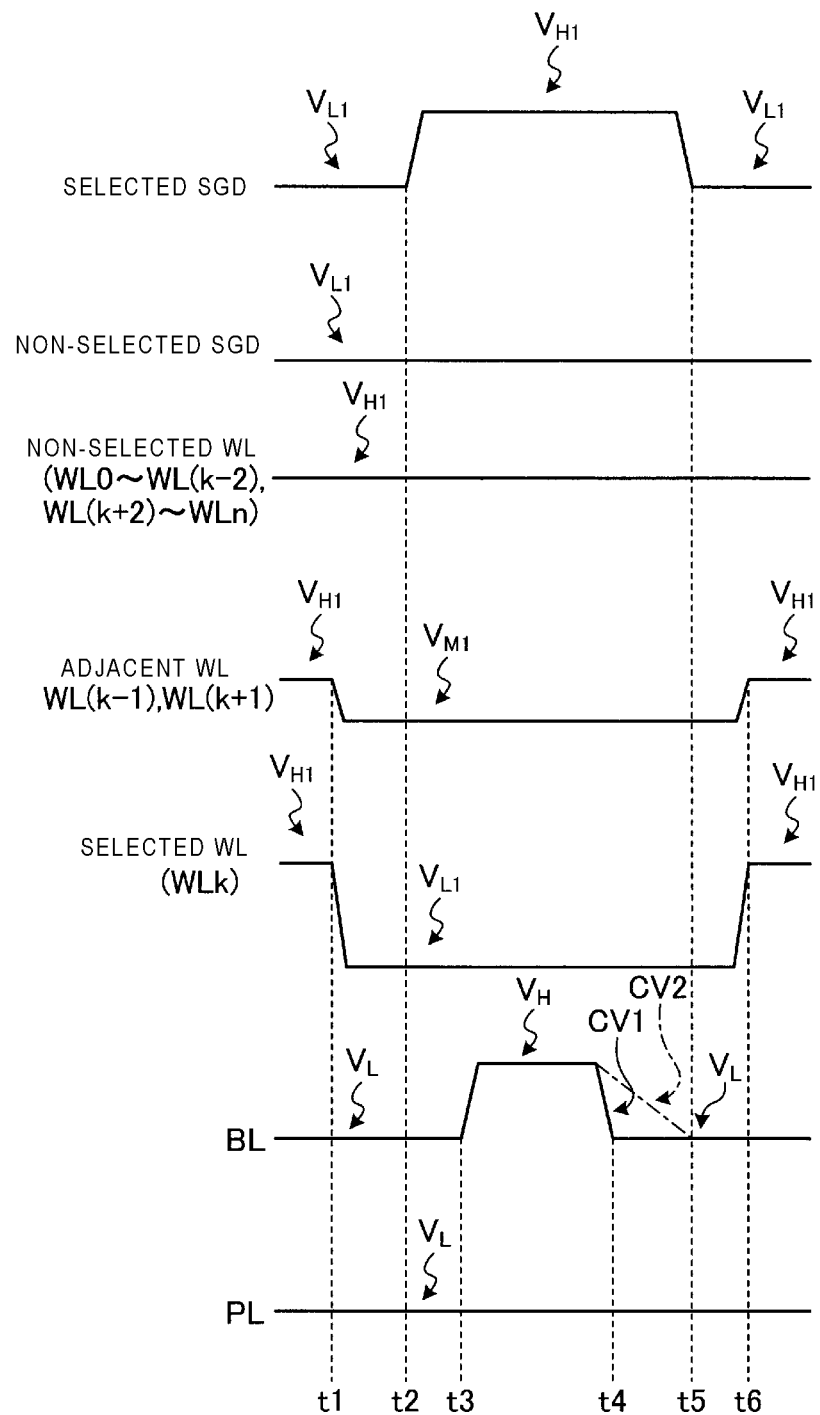
FIG. 8 is a waveform diagram showing the operation of the semiconductor storage device according to the embodiment.

More specifically, the semiconductor storage device 1 operates as shown in FIG. 8. FIG. 8 is a waveform diagram showing the operation of the semiconductor storage device.

For example, in the semiconductor storage device 1, when the write command is received, the peripheral circuit 10 (see FIG. 2) determines the selected word line and a selected chain unit in the memory cell array 2 in accordance with the row address included in the write command.

Before a timing t1, the peripheral circuit 10 sets a voltage of the bit line BL to a first drive level (for example, a low level $V_L$), and set a voltage of the plate line PL to the first drive level (for example, the low level $V_L$). For example, a high level $V_H$=5 V and the low level $V_L$=0 V may be used, or the high level $V_H$=3 V and low level $V_L$=0 V may be used.

At a timing t1, the peripheral circuit 10 maintains a voltage of non-selected word lines WL0 to WL(k−2) and WL(k+2) to WLn at a non-active level (for example, a high level $V_{H1}$) and changes voltages of the selected word line WLk, adjacent word lines WL(k−1) and WL(k+1) from the non-active level (for example, the high level $V_{H1}$) to the active level (for example, a low level $V_{L1}$) and a predetermined level (for example, a middle level $V_{M1}$), respectively. The middle level $V_{M1}$ satisfies a following Formula 1.

$$V_{H1} > V_{M1} > V_{L1} \qquad \text{Formula 1}$$

Accordingly, a select transistor of a selected memory cell MCk in each memory chain CH is selectively turned off, select transistors of adjacent memory cells MC(k−1) and MC(k+1) are weakly turned on, and select transistors of non-selected memory cells MC0 to MC(k−2) and MC(k+2) to MCn are maintained in an ON state. For example, the high level $V_{H1}$=5 V, the middle level $V_{M1}$=3.5 V, and the low level $V_{L1}$=0 V may be used, or the high level $V_{H1}$=3 V, the middle level $V_{M1}$=2 V, and the low level $V_{L1}$=0 V may be used.

At a timing t2, the peripheral circuit 10 maintains a voltage of a select gate line SGD of a non-selected chain unit at the non-active level (for example, the low level $V_{L1}$) and changes the voltage of the select gate line SGD of the selected chain unit from the non-active level (for example, the low level $V_{L1}$) to the active level (for example, the high level $V_{H1}$). Accordingly, the drain-side select transistor DST of the selected chain unit is selectively turned on, and the drain-side select transistor DST of the non-selected chain unit is maintained in an OFF state.

When the select transistor DST is turned on, stress is applied to each memory cell MC of the chain unit. Therefore, the select transistor DST is turned on after a voltage of each word line WL is set.

At a timing t3, the peripheral circuit 10 changes the voltage of the selected bit line BL from the first drive level (for example, the low level $V_L$) to a second drive level (for example, the high level $V_H$). In a period from the timing t3 to a timing t4, the peripheral circuit 10 maintains the voltage of the selected bit line BL at the second drive level (for example, the high level $V_H$). Accordingly, the current may pass through a path of the channel region of the select transistor MT of the non-selected memory cell MC→the channel region of the select transistor MT of the adjacent memory cell MC→the variable resistance material film 43 (variable resistance element R) of the selected memory cell MC→the channel region of the select transistor MT of the adjacent memory cell MC→the channel region of the select transistor MT of the non-selected memory cell MC. As a result, the variable resistance material film 43 (variable resistance element R) of the selected memory cell MC can be brought into a molten state and can be brought into a high resistance state (reset state) or a low resistance state (set state) according to a subsequent voltage drop speed, and information can be written to the selected memory cell MC.

Figure 9A:
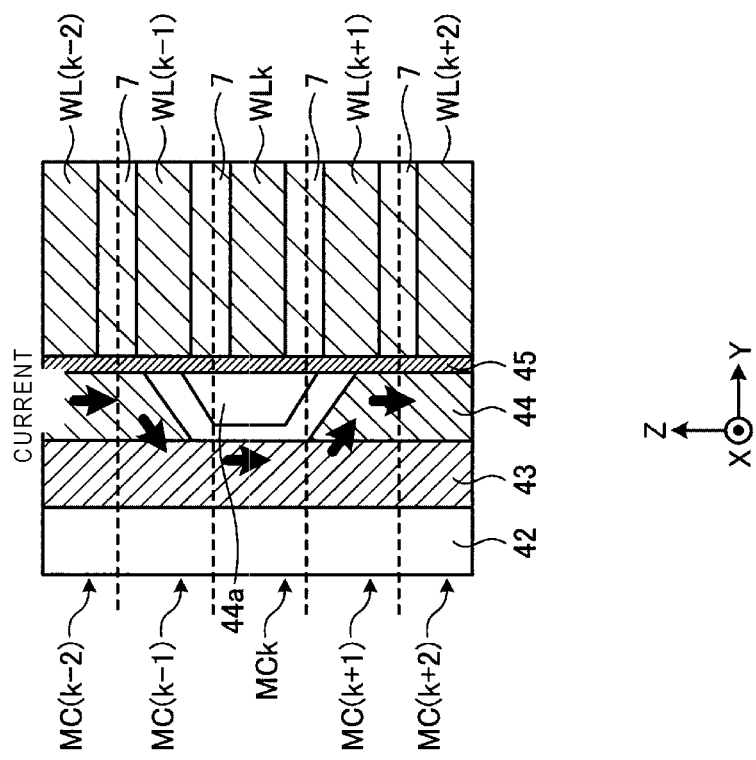

Here, tentatively, when the select transistor of the selected memory cell MCk is selectively turned off, and the select transistors of the other non-selected memory cells MC0 to MC(k−1) and MC(k+1) to MCn are maintained in the ON state, as shown in FIG. 9A, in the selected memory cell MCk, a depletion layer 44a may be formed in a trapezoidal shape on the semiconductor film 44. The depletion layer 44a may have a shape in which a width of the depletion layer 44a in the Z direction gradually decreases as the depletion layer 44a approaches the variable resistance material film 43 from the insulating film 45. The depletion layer 44a may slightly penetrate into the regions of the adjacent memory cells MC(k−1) and MC(k+1) in a part of the semiconductor film 44 near the insulating film 45, and an inclination of a hypotenuse of the trapezoid may be relatively steep relative to an interface between the semiconductor film 44 and the insulating film 45. Accordingly, as shown by an arrow in FIG. 9A, a large current also flows into the variable resistance material film 43 of the adjacent memory cells MC(k−1) and MC(k+1), and information may be erroneously written in the adjacent memory cells MC(k−1) and MC(k+1).

On the other hand, in the present embodiment, the select transistor of the selected memory cell MCk is selectively turned off, the select transistors of the adjacent memory cells MC(k−1) and MC(k+1) are weakly turned on, and the select transistors of the non-selected memory cells MC0 to MC(k−2) and MC(k+2) to MCn are maintained in the ON state. Accordingly, as shown in FIG. 9B, in the selected memory cell MCk, the depletion layer 44a may be formed on the semiconductor film 44 in a trapezoidal shape in which inclination of the hypotenuse is gentle relative to the interface between the semiconductor film 44 and the insulating film 45, and the cell current can also be reduced to appropriate magnitude. Accordingly, a current having appropriately reduced magnitude flows in a direction from the semiconductor film 44 of the adjacent memory cell MC(k−1) toward the variable resistance material film 43 of the selected memory cell MCk, and a direction from the resistance change material film 43 of selected memory cell MCk toward the semiconductor film 44 of the adjacent memory cell MC(k+1). That is, in order to prevent heat from being transferred to the adjacent memory cells MC(k−1) and MC(k+1), the current flowing through the selected memory cell MCk is reduced and the heat generated in the region of the variable resistance material film 43 of the selected memory cell MCk is appropriately reduced, so that heat conduction to the adjacent memory cells MC(k−1) and MC(k+1) can be prevented. Accordingly, the variable resistance material film 43 of the adjacent memory cells MC(k−1) and MC(k+1) can be prevented from being brought into the molten state while the variable resistance material film 43 (variable resistance element R) of the selected memory cell MC is brought into the molten state. As a result, erroneous writing of information to the adjacent memory cells MC(k−1) and MC(k+1) can be prevented while writing information to the selected memory cell MC.

At the timing t4 shown in FIG. 8, the peripheral circuit 10 changes the voltage of the selected bit line BL from the second drive level (for example, the high level $V_H$) to the first drive level (for example, the low level $V_L$), and then maintains the voltage at the first drive level.

At this time, when it is required to store the data in the high resistance state in the selected memory cell MC, as shown by the solid line in FIG. 8, the peripheral circuit 10 changes the voltage of the selected bit line BL from the second drive level to the first drive level at a changing speed CV1. The changing speed CV1 is a changing speed of rapidly cooling the variable resistance material film 43 (variable resistance element R) from the molten state.

When it is required to store the data in the low resistance state in the selected memory cell MC, as shown by the one dot chain line in FIG. 8, the peripheral circuit 10 changes the voltage of the selected bit line BL from the second drive level to the first drive level at a changing speed CV2. The changing speed CV2 is a changing speed of gradually cooling the variable resistance material film 43 (variable resistance element R) from the molten state.

At a timing t5, the peripheral circuit 10 maintains a voltage of a select gate line SGD of a non-selected chain unit at the non-active level (for example, the low level $V_{L1}$) and changes the voltage of the select gate line SGD of the selected chain unit from the active level (for example, the high level $V_{H1}$) to the non-active level (for example, the low level $V_{L1}$). Accordingly, the drain-side select transistor DST of the selected chain unit is turned off, and the drain-side select transistor DST of each chain unit is maintained in the OFF state.

At a timing t6, the peripheral circuit 10 maintains a voltage of non-selected word lines WL0 to WL(k−2) and WL(k+2) to WLn at the non-active level (for example, the high level $V_{H1}$) and changes voltages of the selected word line WLk and adjacent word lines WL(k−1) and WL(k+1) from the active level (for example, the low level $V_{L1}$) and the predetermined level (for example, the middle level $V_{M1}$) to the non-active level (for example, the high level $V_{H1}$), respectively. Accordingly, the select transistor of the selected memory cell in each memory chain CH is turned on, and the transistor of each memory cell is maintained in the ON state.

As described above, in the present embodiment, in the semiconductor storage device 1, in the writing operation performed on the selected memory cell MC in the memory cell array 2, the voltage $V_{M1}$ that is higher than the selected voltage $V_{L1}$ and is different from a non-selected voltage $V_{H1}$ is applied to the word line WL connected to the non-selected memory cell MC that is adjacent to the selected memory cell MC. The voltage $V_{M1}$ has, for example, a level between the selected voltage $V_{L1}$ and the non-selected voltage $V_{H1}$. Accordingly, since the flow of a cell current into the variable resistance material film 43 of the adjacent memory cell MC can be prevented while promoting an effective flow of a cell current into the variable resistance material film 43 of the selected memory cell MC, erroneous writing of information to the adjacent memory cells MC(k−1) and MC(k+1) can be prevented while writing information to the selected memory cell MC. As a result, the size of the memory cell MC and the interval between the memory cells MCs in the Z direction can be reduced, and the semiconductor storage device 1 can be highly integrated.

As long as the low level $V_{L1}$ which is the selected voltage applied to the selected word line is a level sufficient to turn off the select transistor MT of the selected memory cell MC, the low level $V_{L1}$ is not limited to a ground voltage (0 V) and may be a negative voltage.

The voltage $V_{M1}$ that is higher than the selected voltage $V_{L1}$ and is different from the non-selected voltage $V_{H1}$ may be applied to the word line WL that is connected to the memory cell MC adjacent to the selected memory cell MC on just one side in the Z direction.

For example, at the timing t1, the peripheral circuit 10 may maintain a voltage of non-selected word lines WL0 to WL(k−2) and WL(k+1) to WLn at the non-active level (for example, the high level $V_{H1}$) and change voltages of the selected word line WLk and the adjacent word line WL(k−1) from the non-active level (for example, the high level $V_{H1}$) to the active level (for example, the low level $V_{L1}$) and the predetermined level (for example, the middle level $V_{M1}$), respectively. Accordingly, erroneous writing of information to the adjacent memory cell MC(k−1) can be prevented while writing information to the selected memory cell MC.

Alternatively, at the timing t1, the peripheral circuit 10 may maintain a voltage of non-selected word lines WL0 to WL(k−1) and WL(k+2) to WLn at the non-active level (for example, the high level $V_{H1}$) and change voltages of the selected word line WLk and the adjacent word line WL(k+1) from the non-active level (for example, the high level $V_{H1}$) to the active level (for example, the low level $V_{L1}$) and the predetermined level (for example, the middle level $V_{M1}$), respectively. Accordingly, erroneous writing of information to the adjacent memory cell MC(k+1) can be prevented while writing information to the selected memory cell MC.

Figure 10:
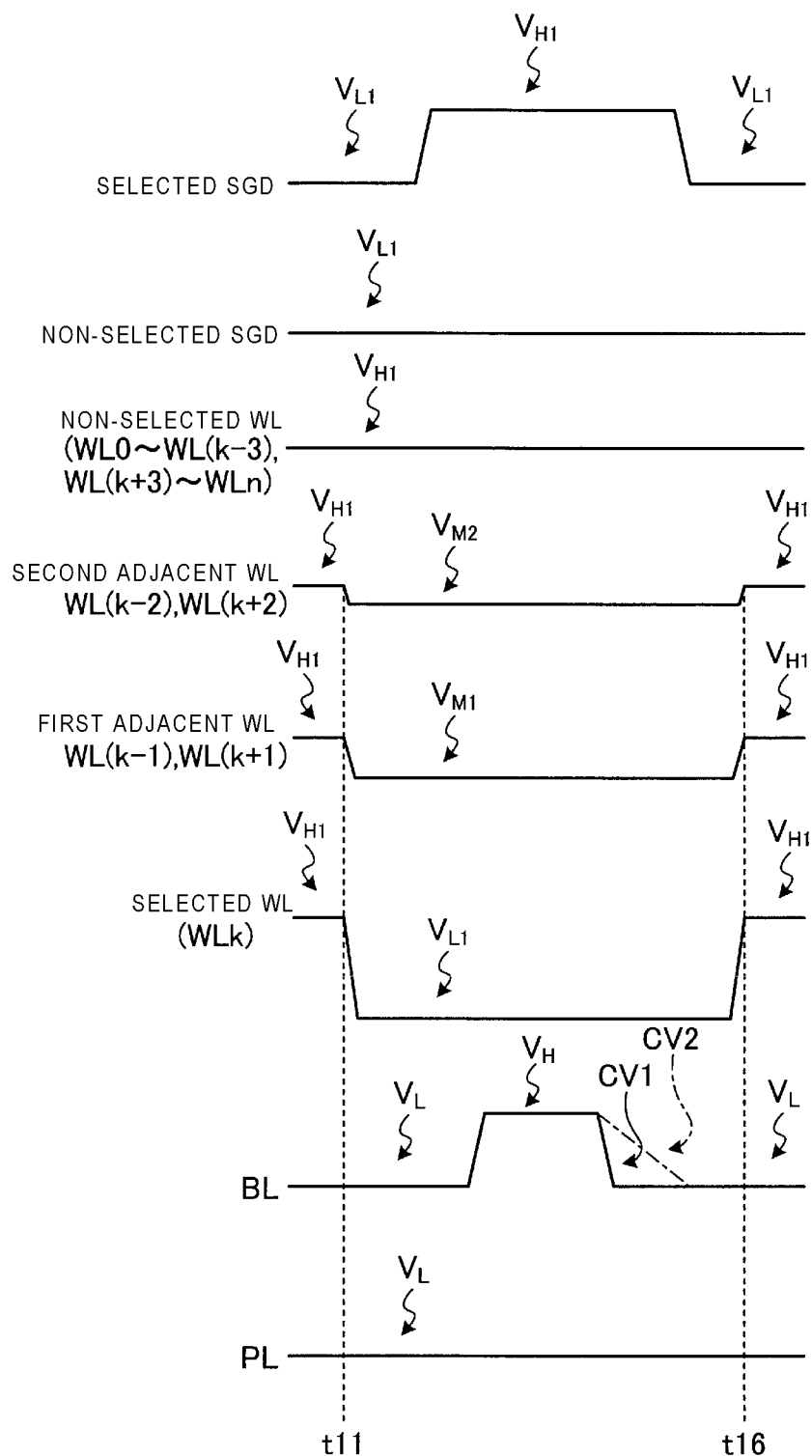
FIG. 10 is a waveform diagram showing an operation of a semiconductor storage device according to a first modification of the embodiment.

Alternatively, voltages may be applied to word lines in a stepwise manner. For example, the semiconductor storage device 1 may operate as shown in FIG. 10. FIG. 10 is a waveform diagram showing an operation of a semiconductor storage device according to a first modification of the embodiment.

The word lines WL(k−1) and WL(k+1) adjacent to the selected word line WLk are referred to as first adjacent word lines, and word lines adjacent to the first adjacent word lines WL(k−1) and WL(k+1) on an opposite side of the selected word line WLk are referred to as second adjacent word lines.

At a timing t11, the peripheral circuit 10 maintains a voltage of non-selected word lines WL0 to WL(k−3) and WL(k+3) to WLn at the non-active level (for example, the high level $V_{H1}$) and changes voltages of the selected word line WLk, the first adjacent word lines WL(k−1) and WL(k+1), and the second adjacent word lines WL(k−2) and WL(k+2) from the non-active level (for example, the high level $V_{H1}$) to the active level (for example, the low level $V_{L1}$), the predetermined level (for example, the middle level $V_{M1}$), and another predetermined level (For example, a middle level $V_{M2}$), respectively. The middle level $V_{M1}$ and the middle level $V_{M2}$ satisfy a following Formula 2.

$$V_{H1} > V_{M2} > V_{M1} > V_{L1} \qquad \text{Formula 2}$$

Accordingly, a select transistor of the selected memory cell MCk in each memory chain CH is selectively turned off, select transistors of first adjacent memory cells MC(k−1) and MC(k+1) are weakly turned on, select transistors of second adjacent memory cells MC(k−2) and MC(k+2) are slightly weakly turned on, and select transistors of non-selected memory cells MC0 to MC(k−3) and MC(k+3) to MCn are maintained in an ON state. For example, the high level $V_{H1}$=5 V, the middle level $V_{M2}$=4.2 V, the middle level $V_{M1}$=3.5 V, and the low level $V_{L1}$=0 V may be used, or the high level $V_{H1}$=3 V, the middle level $V_{M2}$=2.5 V, the middle level $V_{M1}$=2 V, and the low level $V_{L1}$=0 V may be used.

At a timing t16, the peripheral circuit 10 maintains a voltage of non-selected word lines WL0 to WL(k−3) and WL(k+3) to WLn at the non-active level (for example, the high level $V_{H1}$) and returns voltages of the selected word line WLk, the first adjacent word lines WL(k−1) and WL(k+1), and the second adjacent word lines WL(k−2) and WL(k+2) from the active level (for example, the low level $V_{L1}$), the predetermined level (for example, the middle level $V_{M1}$), and another predetermined level (For example, the middle level $V_{M2}$) to the non-active level (for example, the high level $V_{H1}$), respectively. Accordingly, the select transistor of the selected memory cell in each memory chain CH is turned on, and then each memory cell select transistor is maintained in the ON state.

By such a writing operation, the flow of the cell current into the variable resistance material film 43 of the first adjacent memory cell MC and the second adjacent memory cell MC can be prevented while promoting an effective flow of the cell current into the variable resistance material film 43 of the selected memory cell MC.

Figure 11:
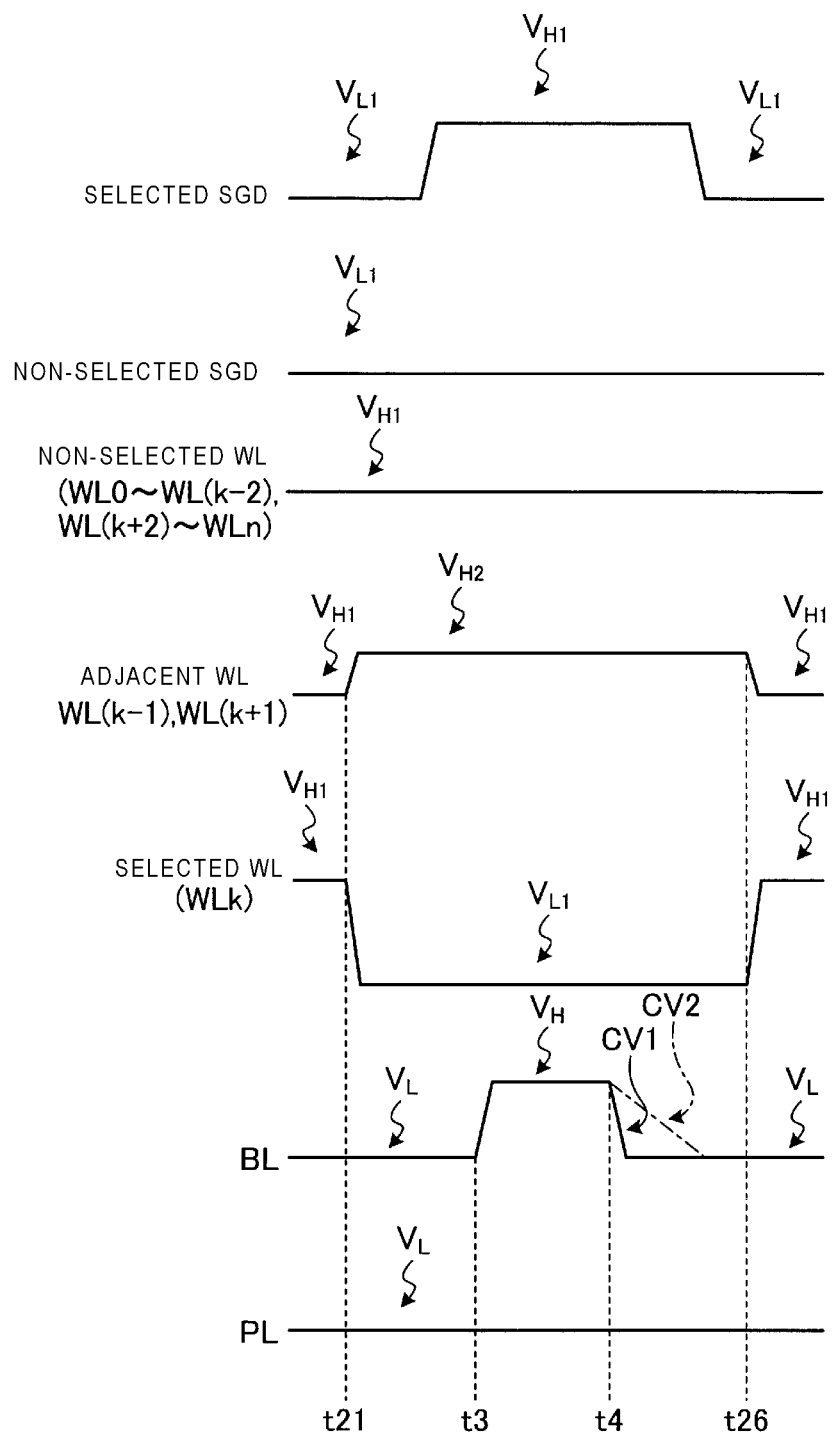
FIG. 11 is a waveform diagram showing an operation of a semiconductor storage device according to a second modification of the embodiment.

Alternatively, instead of weakly turning off the select transistor MT of the adjacent memory cell MC, the select transistor MT may be strongly turned on. For example, the semiconductor storage device 1 may operate as shown in FIG. 11. FIG. 11 is a waveform diagram showing an operation of a semiconductor storage device according to a second modification of the embodiment.

At a timing t21, the peripheral circuit 10 maintains the voltage of the non-selected word lines WL0 to WL(k−2) and WL(k+2) to WLn at the non-active level (for example, the high level $V_{H1}$) and changes the voltages of the selected word line WLk and the adjacent word lines WL(k−1) and WL(k+1) from the non-active level (for example, the high level $V_{H1}$) to the active level (for example, the low level $V_{L1}$) and the predetermined level (for example, the high level $V_{H2}$), respectively. The high level $V_{H2}$ satisfies a following Formula 3.

$$V_{H2} > V_{H1} > V_{L1} \quad \text{Formula 3}$$

Accordingly, the select transistor of the selected memory cell MCk in each memory chain CH is selectively turned off, the select transistors of adjacent memory cells MC(k−1) and MC(k+1) are strongly turned on, and the select transistors of the non-selected memory cells MC0 to MC(k−2) and MC(k+2) to MCn are maintained in the ON state. For example, the high level $V_{H1}$=5 V, the high level $V_{H2}$=6 V, and the low level $V_{L1}$=0 V, or the high level $V_{H1}$=3 V, the high level $V_{H2}$=4 V, and the low level $V_{L1}$=0 V may be used.

At the timing t3, the peripheral circuit 10 changes the voltage of the selected bit line BL from the first drive level (for example, the low level $V_L$) to the second drive level (for example, the high level $V_H$). In the period from the timing t3 to the timing t4, the peripheral circuit 10 maintains the voltage of the selected bit line BL at the second drive level (for example, the high level $V_H$).

Here, tentatively, when the select transistor of the selection memory cell MCk is selectively turned off and the select transistors of the non-selected memory cells MC0 to MC(k−1) and MC(k+1) to MCn are maintained in the ON state, as shown in FIG. 12A, in the selected memory cells MCk, the depletion layer 44a may be formed in the trapezoidal shape on the semiconductor film 44. The depletion layer 44a may have a shape in which the width in the Z direction gradually decreases as the depletion layer 44a approaches the variable resistance material film 43 from the insulating film 45. The depletion layer 44a slightly penetrates into the regions of the adjacent memory cells MC(k−1) and MC(k+1) in the part of the semiconductor film 44 near the insulating film 45. Accordingly, as shown by an arrow in FIG. 9A, since a large cell current can also flow into the variable resistance material film 43 of the adjacent memory cells MC(k−1) and MC(k+1) and the variable resistance material film 43 can be brought into a molten state, information may be erroneously written in the adjacent memory cells MC(k−1) and MC(k+1).

On the other hand, in the present embodiment, the select transistor of the selected memory cell MCk is selectively turned off, the select transistors of the adjacent memory cells MC(k−1) and MC(k+1) are strongly turned on, and the select transistors of the non-selected memory cells MC0 to MC(k−2) and MC(k+2) to MCn are maintained in the ON state. Accordingly, as shown in FIG. 12B, in the selected memory cell MCk, the depletion layer 44a may be formed on the semiconductor film 44 in a trapezoidal shape at a position where the hypotenuse enters toward the side of the selected memory cell MCk. Accordingly, the cell current flows in a direction from the semiconductor film 44 of the adjacent memory cell MC(k−1) toward the variable resistance material film 43 of the selected memory cell MCk through a part of the semiconductor film 44 of the selected memory cell MCk, and a direction from the resistance change material film 43 of the selected memory cell MCk toward the semiconductor film 44 of the adjacent memory cell MC(k+1) through a part of the semiconductor film 44 of the selected memory cell MCk. Accordingly, the variable resistance material film 43 (variable resistance element R) of the selected memory cell MC can be brought into the molten state, and the variable resistance material film 43 of the adjacent memory cells MC(k−1) and MC(k+1) can be prevented from being brought into the molten state. As a result, erroneous writing of information to the adjacent memory cells MC(k−1) and MC(k+1) can be prevented while writing information to the selected memory cell MC.

At the timing t4 shown in FIG. 11, the peripheral circuit 10 changes the voltage of the selected bit line BL from the second drive level (for example, the high level $V_H$) to the first drive level (for example, the low level $V_L$), and then maintains the voltage at the first drive level.

At this time, when it is required to store the data in the high resistance state in the selected memory cell MC, as shown by the solid line in FIGS. 12A and 12B, the peripheral circuit 10 changes the voltage of the selected bit line BL from the second drive level to the first drive level at the changing speed CV1. The changing speed CV1 is a changing speed of rapidly cooling the variable resistance material film 43 (variable resistance element R) from the molten state.

When it is required to store the data in the low resistance state in the selected memory cell MC, as shown by the one dot chain line in FIGS. 12A and 12B, the peripheral circuit 10 changes the voltage of the selected bit line BL from the second drive level to the first drive level at the changing speed CV2. The changing speed CV2 is a changing speed of gradually cooling the variable resistance material film 43 (variable resistance element R) from the molten state.

At a timing t26, the peripheral circuit 10 maintains the voltage of the non-selected word lines WL0 to WL(k−2) and WL(k+2) to WLn at the non-active level (for example, the high level $V_{H1}$) and returns the voltages of the selected word line WLk, the adjacent word lines WL(k−1) and WL(k+1) from the non-active level (for example, the low level $V_{L1}$) and the predetermined level (for example, the high level $V_{H2}$) to the non-active level (for example, the high level $V_{H1}$), respectively. Accordingly, the select transistor of the selected memory cell in each memory chain CH is turned on, and then the select transistor of the memory cell is maintained in the ON state.

By such a writing operation, the flow of cell current into the variable resistance material film 43 of the adjacent memory cell MC can be prevented while promoting the effective flow of the cell current into the variable resistance material film 43 of the selected memory cell MC.

Figure 13:
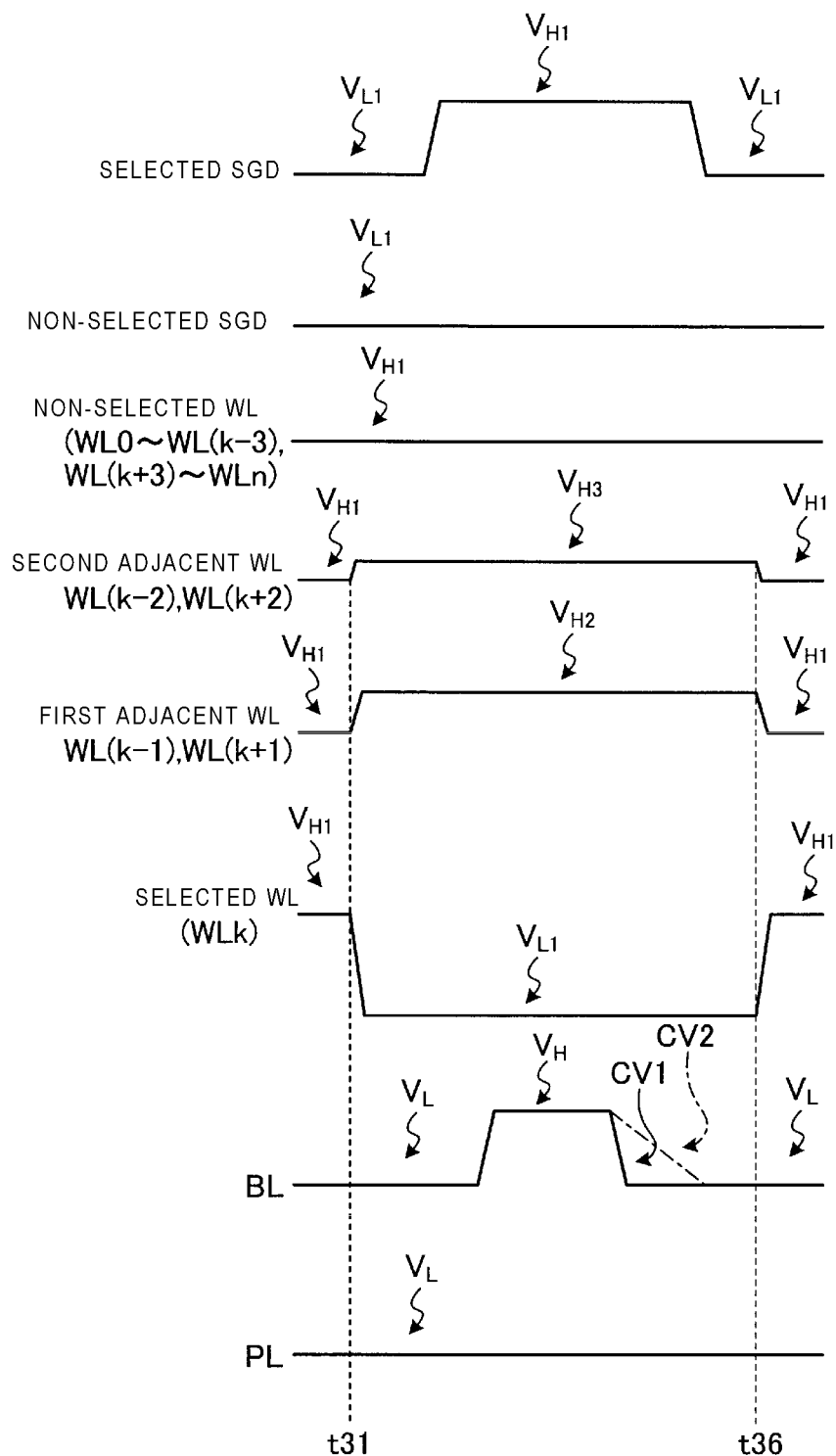
FIG. 13 is a waveform diagram showing an operation of a semiconductor storage device according to a third modification of the embodiment.

Alternatively, voltages may be applied to the word lines in a stepwise manner. For example, the semiconductor storage device 1 may operate as shown in FIG. 13. FIG. 13 is a waveform diagram showing an operation of a semiconductor storage device according to a third modification of the embodiment.

The word lines WL(k−1) and WL(k+1) adjacent to the selected word line WLk are referred to as the first adjacent word lines, and word lines adjacent to the first adjacent word lines WL(k−1) and WL(k+1) on an opposite side of the selected word line WLk are referred to as the second adjacent word lines.

At a timing t31, the peripheral circuit 10 maintains a voltage of non-selected word lines WL0 to WL(k−3) and WL(k+3) to WLn at the non-active level (for example, the high level $V_{H1}$) and changes voltages of the selected word line WLk, the first adjacent word lines WL(k−1) and WL(k+1), and the second adjacent word lines WL(k−2) and WL(k+2) from the non-active level (for example, the high level $V_{H1}$) to the active level (for example, the low level $V_{L1}$), the predetermined level (for example, the high level $V_{H2}$), and another predetermined level (for example, a high level $V_{H3}$), respectively. The high level $V_{H2}$ and the high level $V_{H3}$ satisfies a following Formula 4.

$$V_{H2} > V_{H3} > V_{H1} > V_{L1} \qquad \text{Formula 4}$$

Accordingly, the select transistor of the selected memory cell MCk in each memory chain CH is selectively turned off, the select transistors of the first adjacent memory cells MC(k−1) and MC(k+1) are strongly turned on, the select transistors of second adjacent memory cells MC(k−2) and MC(k+2) are slightly strongly turned on, and the select transistors of the non-selected memory cells MC0 to MC(k−3) and MC (k+3) to MCn are maintained in the ON state. For example, the high level $V_{H1}$=5 V, the high level $V_{H2}$=6 V, the high level $V_{H3}$=5.5 V, and the low level $V_{L1}$=0 V may be used, or the high level $V_{H1}$=3 V, the high level $V_{H2}$=4 V, the high level $V_{H3}$=3.5 V, and the low level $V_{L1}$=0 V may be used.

At a timing t36, the peripheral circuit 10 maintains a voltage of non-selected word lines WL0 to WL(k−3) and WL(k+3) to WLn at the non-active level (for example, the high level $V_{H1}$) and returns voltages of the selected word line WLk, the first adjacent word lines WL(k−1) and WL(k+1), and the second adjacent word lines WL(k−2) and WL(k+2) from the active level (for example, the low level $V_{L1}$), the predetermined level (for example, the high level $V_{H2}$), and the predetermined level (for example, the high level $V_{H3}$) to the non-active level (for example, the high level $V_{H1}$), respectively. Accordingly, the select transistor of the selected memory cell in each memory chain CH is turned on, and then each memory cell select transistor is maintained in the ON state.

By such a writing operation, the flow of a cell current into the variable resistance material film 43 of the first adjacent memory cell MC and the second selected memory cell MC can be prevented while promoting an effective flow of a cell current into the variable resistance material film 43 of the selected memory cell MC.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a plurality of word lines that each extend in a first direction and a second direction orthogonal to the first direction, and are spaced apart from one another in a third direction orthogonal to the first direction and the second direction; and
   a memory pillar that extends in the third direction and penetrates the plurality of word lines, wherein the memory pillar includes
      an insulating film on an outer side of the memory pillar and in contact with the plurality of word lines,
      a semiconductor film that is disposed on an inner side of the insulating film, and
      a variable resistance material film that is disposed on an inner side of the semiconductor film,
   during a writing operation to change a resistance of a part of the variable resistance material film facing a first word line,
      a first voltage is applied to the first word line,
      a second voltage that is higher than the first voltage, is applied to a second word line adjacent to the first word line in the third direction, and
      a third voltage that is higher than the first voltage and different from the second voltage, is applied to a third word line that is not adjacent to the first word line.

2. The semiconductor storage device according to claim 1, further comprising:
   a plate line that extends in the first direction and the second direction;
   a select gate line that extends in the first direction and the second direction and is provided on an opposite side of the plurality of word lines relative to the plate line in the third direction; and
   a bit line that extends in the second direction and is provided on an opposite side of the select gate line relative to plurality of word lines in the third direction, wherein
   a first end of the memory pillar is connected to the bit line, the memory pillar penetrates the select gate line and the plurality of word lines, and a second end of the memory pillar is connected to the plate line, and
   the insulating film on the outer side of the memory pillar is in contact with the select gate line and the plurality of word lines.

3. The semiconductor storage device according to claim 2, wherein
   the second voltage is lower than the third voltage.

4. The semiconductor storage device according to claim 3, wherein during the writing operation, a fourth voltage that is higher than the second voltage and lower than the third voltage, is applied to a fourth word line that is between the second word line and the third word line.

5. The semiconductor storage device according to claim 2, wherein
the second voltage is higher than the third voltage.

6. The semiconductor storage device according to claim 5, wherein during the writing operation,
a fourth voltage that is lower than the second voltage and higher than the third voltage, is applied to a fourth word line that is between the second word line and the third word line.

7. The semiconductor storage device according to claim 2, wherein during the write operation,
while the first, second, and third voltages are applied to the first, second, and third word lines, respectively, a fourth voltage higher than the first voltage is applied to the bit line and then the fourth voltage is decreased at one of two rates to set the resistance of the part of the variable resistance material film facing the first word line to a low resistance state or a high resistance state.

8. The semiconductor storage device according to claim 1, wherein the memory pillar has a columnar shape and each of the plurality of word lines surrounds the memory pillar and is in contact with the insulating film on the outer side of the memory pillar.

9. The semiconductor storage device according to claim 8, wherein the memory pillar has a core insulating film extending along a central axis of the memory pillar, and the variable resistance material film surrounds the core insulating film.

10. The semiconductor storage device according to claim 1, wherein the first voltage applied to the first word line blocks current flow through a part of the semiconductor film facing the first word line and the third voltage applied to the third word line permits current flow through a part of the semiconductor film facing the third word line.

11. A method of performing a write operation in a semiconductor storage device that includes:
a plurality of word lines that each extend in a first direction and a second direction orthogonal to the first direction, and are spaced apart from one another in a third direction orthogonal to the first direction and the second direction; and
a memory pillar that extends in the third direction and penetrates the plurality of word lines, wherein the memory pillar includes
an insulating film on an outer side of the memory pillar and in contact with the plurality of word lines,
a semiconductor film that is disposed on an inner side of the insulating film, and
a variable resistance material film that is disposed on an inner side of the semiconductor film,
said method comprising:
applying a first voltage to the first word line to block current flowing through the semiconductor film facing the first word line,
applying a second voltage that is higher than the first voltage, to a second word line adjacent to the first word line in the third direction, to permit current flowing through the semiconductor film facing the second word line, and
applying a third voltage that is higher than the first voltage and different from the second voltage, to a third word line that is not adjacent to the first word line, to permit current flowing through the semiconductor film facing the third word line.

12. The method according to claim 11, wherein the semiconductor storage device further includes:
a plate line that extends in the first direction and the second direction;
a select gate line that extends in the first direction and the second direction and is provided on an opposite side of the plurality of word lines relative to the plate line in the third direction; and
a bit line that extends in the second direction and is provided on an opposite side of the select gate line relative to plurality of word lines in the third direction, and wherein
a first end of the memory pillar is connected to the bit line, the memory pillar penetrates the select gate line and the plurality of word lines, and a second end of the memory pillar is connected to the plate line, and
the insulating film on the outer side of the memory pillar is in contact with the select gate line and the plurality of word lines.

13. The method according to claim 12, wherein
the second voltage is lower than the third voltage.

14. The method according to claim 13, further comprising:
applying a fourth voltage that is higher than the second voltage and lower than the third voltage, to a fourth word line that is between the second word line and the third word line.

15. The method according to claim 12, wherein
the second voltage is higher than the third voltage.

16. The method according to claim 15, further comprising:
applying a fourth voltage that is lower than the second voltage and higher than the third voltage, to a fourth word line that is between the second word line and the third word line.

17. The method according to claim 12, further comprising:
while the first, second, and third voltages are applied to the first, second, and third word lines, respectively, applying a fourth voltage higher than the first voltage to the bit line and then decreasing the fourth voltage at one of two rates to set a resistance of a part of the variable resistance material film facing the first word line to a low resistance state or a high resistance state.

18. The method according to claim 16, further comprising:
while the first, second, and third voltages are applied to the first, second, and third word lines, respectively, applying a fifth voltage higher than the first voltage to the select gate line to permit current flow through the semiconductor film facing the select gate line.

19. The method according to claim 11, wherein the memory pillar has a columnar shape and each of the plurality of word lines surrounds the memory pillar and is in contact with the insulating film on the outer side of the memory pillar.

20. The method according to claim 19, wherein the memory pillar has a core insulating film extending along a central axis of the memory pillar, and the variable resistance material film surrounds the core insulating film.

* * * * *